(12) United States Patent
Kang et al.

(10) Patent No.: US 11,840,760 B2
(45) Date of Patent: Dec. 12, 2023

(54) LAYER DEPOSITION METHOD AND LAYER DEPOSITION APPARATUS

(71) Applicant: SAMSUNG ELECTRONICS CO., LTD., Suwon-si (KR)

(72) Inventors: Shin-Jae Kang, Seoul (KR); Dong-Hoon Han, Seoul (KR); Do-Hyung Kim, Seongnam-si (KR); Kyung-Wook Park, Daegu (KR); Kevin Bae, Hwaseong-si (KR); Sun-Soo Lee, Yongin-si (KR); In-Jae Lee, Seoul (KR); Jeon-Il Lee, Suwon-si (KR); Chae-Mook Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 394 days.

(21) Appl. No.: 16/207,967

(22) Filed: Dec. 3, 2018

(65) Prior Publication Data

US 2019/0301016 A1    Oct. 3, 2019

(30) Foreign Application Priority Data

Apr. 2, 2018    (KR) .......... 10-2018-0038029

(51) Int. Cl.
| | | |
|---|---|---|
| *C23C 16/455* | (2006.01) | |
| *H01L 21/768* | (2006.01) | |
| *H01L 21/285* | (2006.01) | |
| *C23C 16/34* | (2006.01) | |

(52) U.S. Cl.
CPC ........ *C23C 16/45544* (2013.01); *C23C 16/34* (2013.01); *C23C 16/45561* (2013.01); *H01L 21/28562* (2013.01); *H01L 21/76843* (2013.01)

(58) Field of Classification Search
CPC ........ C23C 16/45544; C23C 16/45561; C23C 16/34; C23C 16/14; C23C 16/45525; C23C 16/45557; H01L 21/76843; H01L 21/28562; H01L 21/76877
See application file for complete search history.

(56) References Cited

U.S. PATENT DOCUMENTS

| | | |
|---|---|---|
| 7,786,010 B2 | 8/2010 | Lee et al. |
| 8,093,158 B2 | 1/2012 | Sato et al. |
| 8,202,367 B2 | 6/2012 | Tachibana et al. |

(Continued)

FOREIGN PATENT DOCUMENTS

| | | |
|---|---|---|
| CN | 107460449 | 12/2017 |
| JP | 0927455 | 1/1997 |

(Continued)

OTHER PUBLICATIONS

Machine Translation, JP '785 (Year: 2014).*

(Continued)

*Primary Examiner* — Michael G Miller
(74) *Attorney, Agent, or Firm* — F. CHAU & ASSOCIATES, LLC

(57) ABSTRACT

In a layer deposition method, a substrate is loaded into a process chamber. A gas filling tank is charged with a gas to a predetermined charge pressure. The pressure of the gas is elevated to a pressure greater than the predetermined charge pressure. The gas is introduced into the process chamber.

9 Claims, 19 Drawing Sheets

(56) References Cited

U.S. PATENT DOCUMENTS

| | | | |
|---|---|---|---|
| 8,590,484 B2 | 11/2013 | Sato et al. | |
| 9,644,266 B2 | 5/2017 | Nasu et al. | |
| 10,214,807 B2 | 2/2019 | Collins et al. | |
| 2004/0083961 A1* | 5/2004 | Basceri | C23C 16/45544 118/712 |
| 2005/0009325 A1* | 1/2005 | Chung | C23C 16/14 438/637 |
| 2005/0011351 A1 | 1/2005 | Park et al. | |
| 2005/0064098 A1* | 3/2005 | Elers | C30B 25/14 427/250 |
| 2005/0081787 A1 | 4/2005 | Im et al. | |
| 2007/0148350 A1* | 6/2007 | Rahtu | H01L 21/3141 427/249.17 |
| 2008/0102204 A1* | 5/2008 | Elers | C23C 16/32 427/249.1 |
| 2009/0053893 A1* | 2/2009 | Khandelwal | C23C 16/45525 438/680 |
| 2009/0263578 A1 | 10/2009 | Lindfors et al. | |
| 2011/0311726 A1* | 12/2011 | Liu | C23C 16/45544 118/695 |
| 2012/0100308 A1* | 4/2012 | Milligan | C23C 16/45542 427/569 |
| 2012/0149209 A1* | 6/2012 | Haywood | C23C 16/04 438/758 |
| 2013/0034947 A1* | 2/2013 | Hong | H01L 45/1616 438/384 |
| 2013/0056702 A1* | 3/2013 | Wang | H01L 21/02192 257/4 |
| 2013/0137262 A1 | 5/2013 | Satoh | |

FOREIGN PATENT DOCUMENTS

| | | |
|---|---|---|
| JP | 09027455 | 1/1997 |
| JP | 1999-141797 | 5/1999 |
| JP | 4866898 | 11/2011 |
| JP | 5520552 | 4/2014 |
| JP | 5524785 | 4/2014 |
| JP | 5524785 B2 * | 6/2014 |
| KR | 100706857 | 4/2007 |
| KR | 10-0807216 | 2/2008 |
| KR | 10-2011-0110749 | 7/2011 |
| KR | 20110078472 A * | 7/2011 |
| KR | 101123828 | 2/2012 |
| KR | 10-1752951 | 6/2017 |
| KR | 1020170099371 | 8/2017 |

OTHER PUBLICATIONS

Machine Translation, KR '472 (Year: 2011).*
Office Action dated Mar. 24, 2022 in corresponding Korean Application No. 10-2018-0038029 (5 pages), in Korean.
Office Action dated Jul. 30, 2021 in corresponding Korean Application No. 10-2018-0074079 (6 pages), in Korean.
Office Action dated Aug. 3, 2022 in corresponding Chinese Application No. 201910071759.1 (11 pages), in Chinese.

* cited by examiner

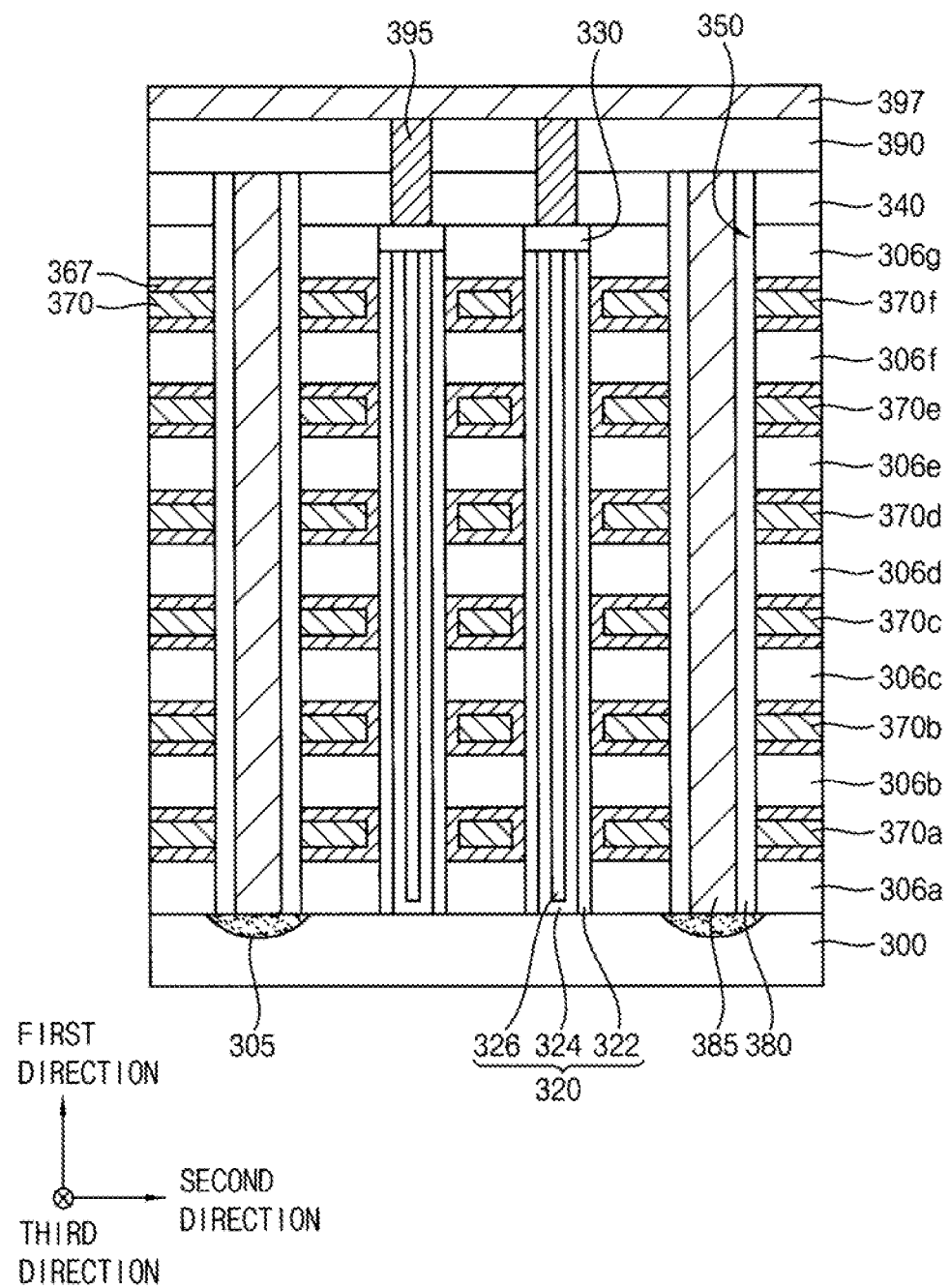

LAYER DEPOSITION METHOD AND LAYER DEPOSITION APPARATUS

CROSS-REFERENCE TO RELATED APPLICATION

This application claims priority under 35 U.S.C. § 119 to Korean Patent Application No. 10-2018-0038029, filed on Apr. 2, 2018 in the Korean Intellectual Property Office (KIPO), the disclosure of which is incorporated by reference herein in its entirety.

1. Technical Field

Exemplary embodiments of the present inventive concept relate to a layer deposition method, and more particularly, to a layer deposition apparatus.

2. Discussion of Related Art

To form a gate electrode of a memory device such as NAND, a metal layer including, for example, tungsten having a relatively low resistance may be used. As a stacked number of the gate electrodes increases according to relatively high degree of integration of the memory device, a deposition gas for forming the tungsten thin film may be decomposed before reaching a bottom surface of an opening having a relatively high aspect ratio, thus reducing step coverage of the tungsten thin film.

SUMMARY

An exemplary embodiment of the present inventive concept provides a layer deposition method for manufacturing a semiconductor device having relatively high reliability, and relatively low defect rates.

An exemplary embodiment of the present inventive concept provides a layer deposition apparatus for performing the layer deposition method.

According to an exemplary embodiment of the present inventive concept, in a layer deposition method, a substrate is loaded into a process chamber. A gas filling tank is charged with a gas to a predetermined charge pressure. The pressure of the gas is elevated to a pressure greater than the predetermined charge pressure. The gas is introduced into the process chamber.

According to an exemplary embodiment of the present inventive concept, in a layer deposition method, a substrate is loaded into a process chamber. A source gas is introduced into the process chamber. A gas filling tank is charged with a reaction gas to a predetermined charge pressure. The pressure of the reaction gas is elevated to a pressure greater than the predetermined charge pressure. The reaction gas is introduced into the process chamber.

According to an exemplary embodiment of the present inventive concept, a layer deposition apparatus includes a process chamber receiving a substrate and providing a space for performing a deposition process. A source gas supply is configured to supply a source gas from a source gas supply source to the process chamber. A reaction gas supply is configured to supply a reaction gas from a reaction gas supply source to the process chamber. At least one of the source gas supply or the reaction gas supply includes a gas filling tank charging the source gas or the reaction gas to a predetermined charge pressure. At least one of the source gas supply or the reaction gas supply supplies the source gas or the reaction gas having a pressure greater than the predetermined charge pressure to the process chamber.

According to an exemplary embodiment of the present inventive concept, at least one gas filling tank may be charged with a reaction gas supplied from a reaction gas supply source to a predetermined charge pressure, and then, the reaction gas may be pressure-elevated to have a pressure greater than the charge pressure and may be supplied to a process chamber.

According to an exemplary embodiment of the present inventive concept, a deposition method includes positioning a substrate in a process chamber. The method includes charging a plurality of gas filling tanks with a deposition gas. Each of the plurality of gas filling tanks is charged to a predetermined charge pressure. The method includes elevating a pressure of a first gas filling tank of the plurality of gas filling tanks to a pressure greater than the predetermined charge pressure. The method includes introducing gas from the first gas filing tank of the plurality of gas filling tanks into the process chamber. The method includes elevating a pressure of a second gas filling tank of the plurality of gas filling tanks to a pressure greater than the predetermined charge pressure. The method includes introducing gas from the second gas filing tank of the plurality of gas filling tanks into the process chamber. The gas from the first gas filing tank of the plurality of gas filling tanks is introduced into the process chamber at a different time from a time at which the gas from the second gas filling tank of the plurality of gas filling tanks is introduced into the process chamber.

Accordingly, the reaction gas may be supplied such that a sufficient amount of the reaction gas reaches a bottom surface of an opening having a relatively high aspect ratio, thus increasing step coverage characteristics of a thin film and UPEH (Unit Per Equipment Hour).

BRIEF DESCRIPTION OF THE DRAWINGS

The above and other features of the present inventive concept will become more apparent by describing in detail exemplary embodiments thereof with reference to the accompanying drawings, in which:

FIGS. 16 to 22 are cross-sectional views of a method of manufacturing a semiconductor device in accordance with an exemplary embodiment of the present inventive concept.

DETAILED DESCRIPTION OF EXAMPLE EMBODIMENTS

Figure 1:
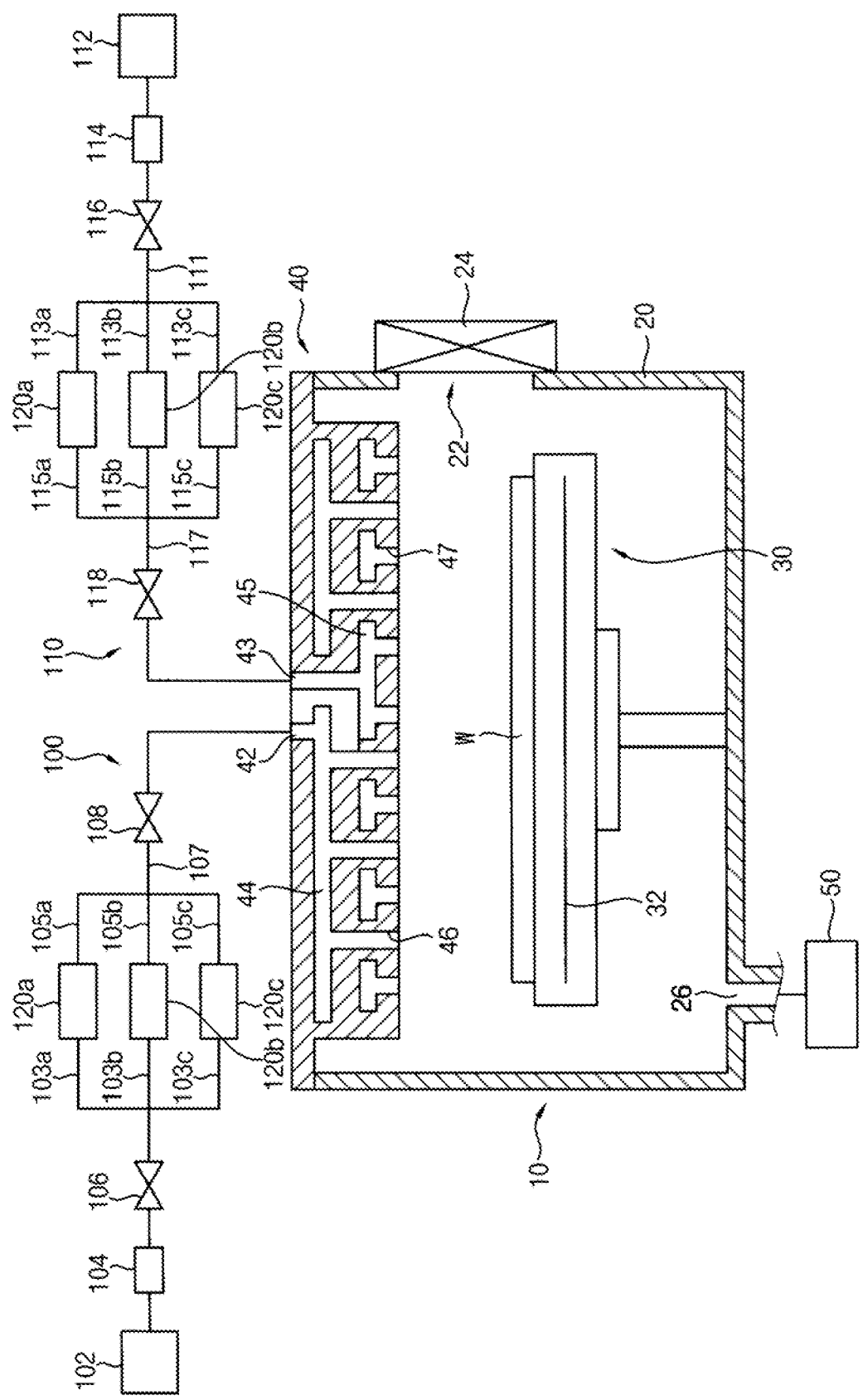
FIG. 1 is a view of a layer deposition apparatus in accordance with an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

Figure 2:
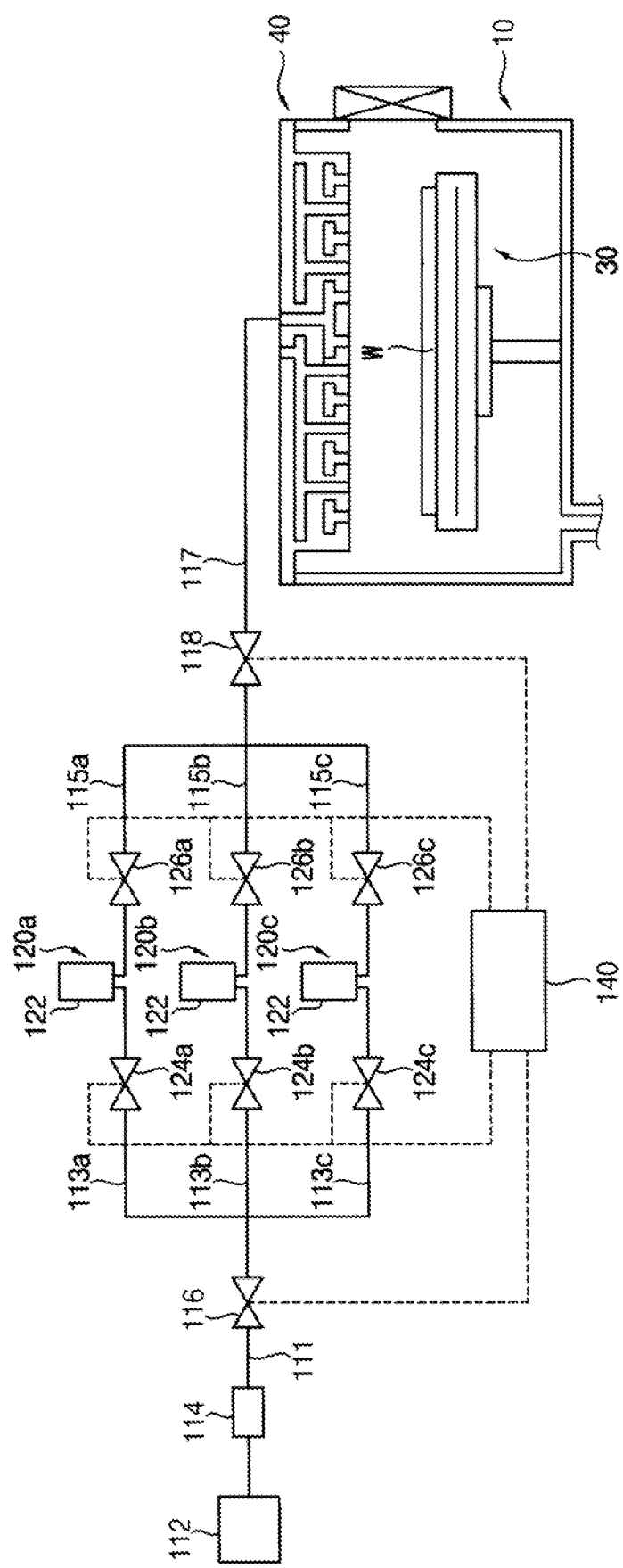
FIG. 2 is a block diagram of a reaction gas supply in FIG. 1.
Figure 3:
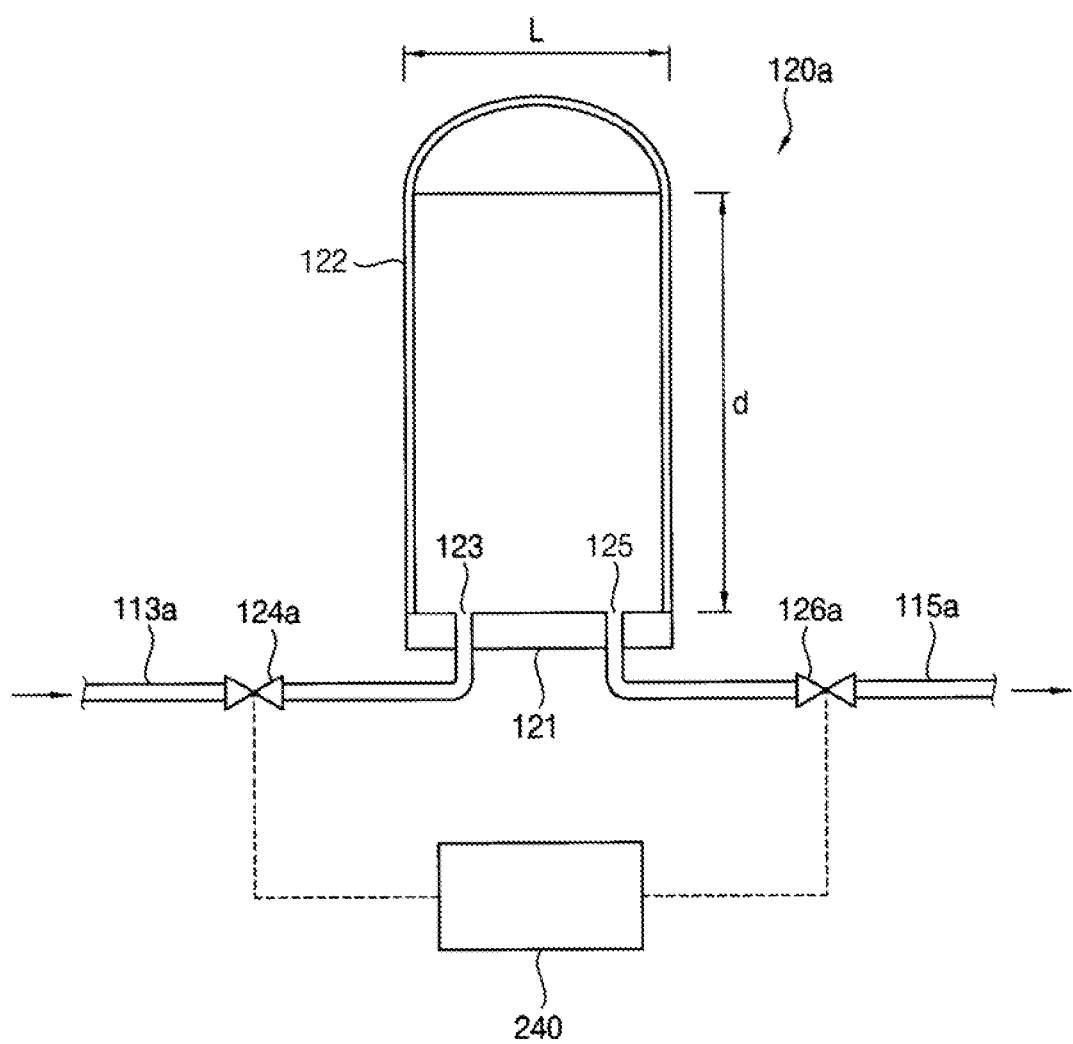
FIG. 3 is a cross-sectional view of a gas filling tank of the reaction gas supply in FIG. 2.
Figure 4:
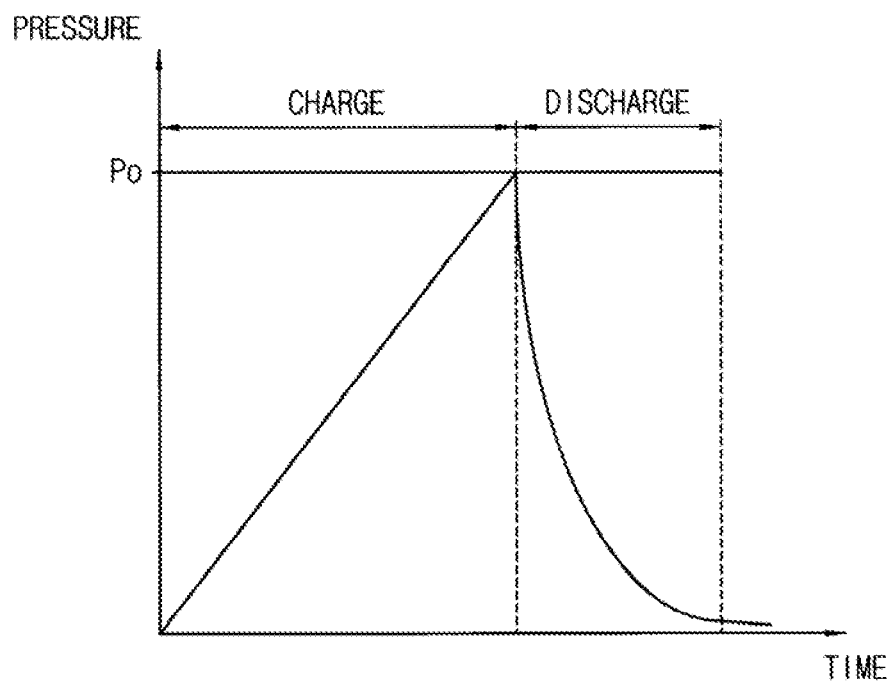
FIG. 4 is a graph of an exemplary pressure change of a reaction gas within the gas filling tank in FIG. 3.
Figure 5:
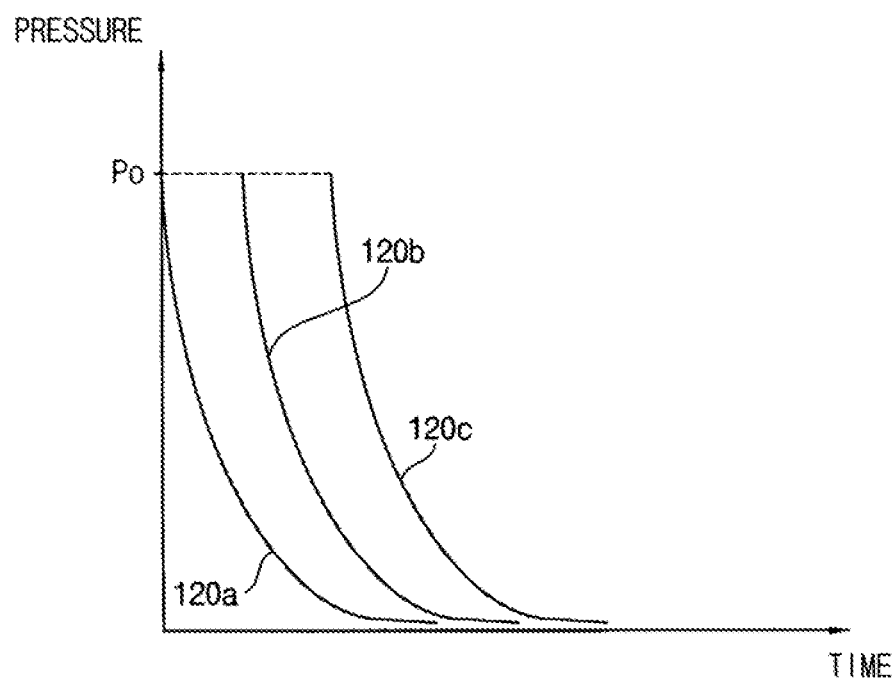
FIG. 5 is a graph of exemplary pressure changes within first to third gas filling tanks in a reaction gas discharge step in accordance with an exemplary embodiment of the present inventive concept.
Figure 6:
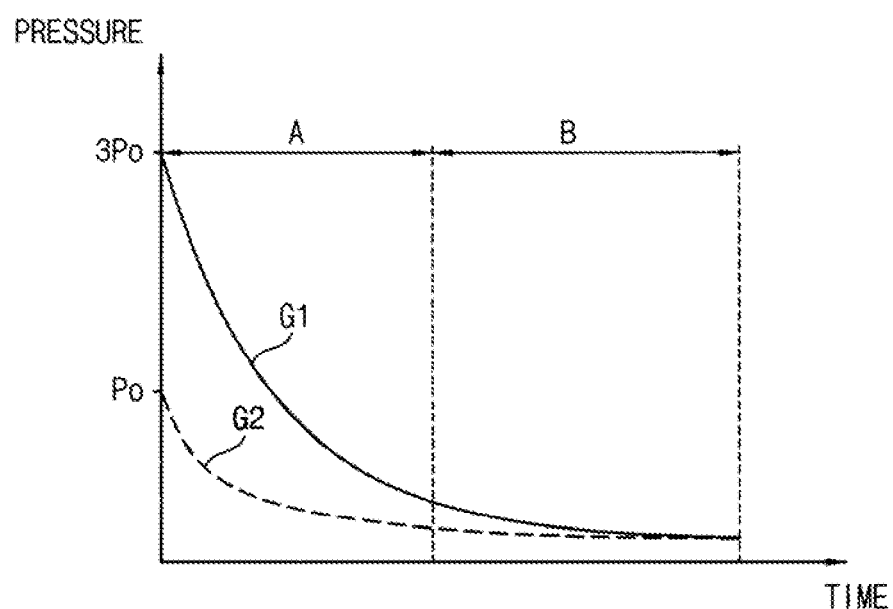
FIG. 6 is a graph of an exemplary pressure change of the reaction gas supplied from the reaction gas supply to a process chamber in accordance with an exemplary embodiment of the present inventive concept.

FIG. 1 is a view of a layer deposition apparatus in accordance with an exemplary embodiment of the present inventive concept. FIG. 2 is a block diagram of a reaction gas supply in FIG. 1. FIG. 3 is a cross-sectional view of a gas filling tank of the reaction gas supply in FIG. 2. FIG. 4 is a graph of an exemplary pressure change of a reaction gas within the first gas filling tank in FIG. 3. FIG. 5 is a graph of exemplary pressure changes within first to third gas filling tanks in a reaction gas discharge step in accordance with an exemplary embodiment of the present inventive concept. FIG. 6 is a graph of an exemplary pressure change of the reaction gas supplied from the reaction gas supply to a process chamber in accordance with an exemplary embodiment of the present inventive concept.

Referring to FIGS. 1 to 6, a layer deposition apparatus may include a process chamber 10, a source gas supply 100, and a reaction gas supply 110.

In an exemplary embodiment of the present inventive concept, the process chamber 10 may receive a substrate W and may provide a space for performing a deposition process. The process chamber 10 may be used for an atomic layer deposition (ALD) process.

The substrate W may be an object on which a thin film including tungsten is formed. For example, the substrate W may include a semiconductor wafer such as a silicon wafer or a germanium wafer. The substrate W may include various structures, for example, the substrate W includes a plurality of stacked layers, such as a plurality of silicon layers.

For example, a conductive layer including a metal, a metal nitride, a metal silicide, a metal oxide or the like, an electrode, or an insulation layer including silicon oxide or silicon nitride may be formed on the substrate W. In an exemplary embodiment of the present inventive concept, an insulation layer including a hole or an opening therein may be formed on the substrate W, and the thin film including tungsten may be vapor-deposited in the hole or the opening through subsequent processes.

The process chamber 10 may include a substrate support 30 within a chamber 20 as a susceptor on which the substrate W is loaded. The substrate support 30 may be a platform positioned in the chamber 20. The chamber 20 may be an airtight vessel sealed off from outside the chamber 20. One or more substrates W may be disposed on the substrate support 30. The substrate support 30 may be installed to be movable upwardly and downwardly. For example, the substrate support 30 may be coupled to a pneumatic arm configured to move in an upward and downward direction. Additionally, the substrate support 30 may be installed to be rotatable. For example, the substrate support 30 may include a platform coupled to a motor configured to rotate in a clockwise and/or counterclockwise direction.

The substrate support 30 may include a heater 32. The heater 32 may be connected to a heater power supply and may heat the substrate W to a desired temperature. For example, the heater 32 may be an electric heater.

A gate 22 for loading/unloading the substrate W may be provided in a sidewall of the chamber 20, and a gate valve 24 for opening/closing the gate 22 may be installed. The gate valve 24 may be used to pass air into or out of the chamber 20 to control an air pressure within the chamber 20. A heater may be installed on the sidewall of the chamber 20, and may be used to control the temperature of the chamber 20 during the layer deposition process. For example, the chamber 20 may be maintained under a temperature of from about 200° C. to about 600° C.

An exhaust port 26 may be provided in a bottom wall of the chamber 20. An exhaust device 50 including a vacuum pump, and a pressure control valve may be connected to the exhaust port 26 via an exhaust pipe. An interior of the chamber 20 may be maintained in a predetermined depressurized state by operation of the exhaust device 50.

A shower head 40 may be provided in a top wall of the chamber 20. The shower head 40 may be installed in an open upper end of the chamber 20. The shower head 40 may include an upper space 44 and a lower space 45. A first gas introduction channel 42 may be connected to the upper space 44, and first gas injection channels 46 may extend to a bottom surface of the shower head 40. A second gas introduction channel 43 may be connected to the lower space 45, and second gas injection channels 47 may extend to the bottom surface of the shower head 40.

The shower head 40 may be configured to supply a source gas and a reaction gas as a film formation source gas into the chamber 20 through the first and second gas injection channels 46, 47.

In an exemplary embodiment of the present inventive concept, the source gas supply 100 may include a plurality of gas filling tanks 120a, 120b, 120c charging the source gas supplied from a source gas supply source 102 to a predetermined charge pressure P respectively, and may collect the source gas discharged from the gas filling tanks 120a, 120b, 120c and supply to the process chamber 10. The gas filling tanks 120a, 120b and 120c may be referred to as first, second and third gas filling tanks, respectively. The gas filling tanks 120a, 120b and 120c may be charged and/or discharged sequentially or substantially simultaneously.

The source gas supply source 102 may include a bubbler and may vaporize a metallic precursor and supply to the process chamber 10. Examples of the source gas may be $WF_6$, $WCl_6$, $WBr_6$, $W(Co)_6$, $W(C_2H_2)_6$, $W(PF_3)_6$, or $(C_2H_5)WH_2$.

The source gas supply 100 may include a first flow controller 104. The first flow controller 104 may control a flow rate of the source gas. The source gas supply 100 may include a supply control valve 106 installed in a charge line and configured to control a flow of the source gas supplied to the gas filling tanks 120a, 120b, 120c. For example, the supply control valve 106 may include open and closed configurations. The first flow controller 104 may be positioned between the source gas supply source 102 and the first to third gas filling tanks 120a, 120b, 120c of the source gas supply 100.

Descriptions of technical features or aspects of an exemplary embodiment of the present inventive concept should typically be considered as available and applicable to other similar features or aspects in another exemplary embodiment of the present inventive concept. Accordingly, technical features described herein according to one exemplary embodiment of the present inventive concept may be applicable to other exemplary embodiments of the present inventive concept, and thus duplicative descriptions may be omitted herein. The source gas supply may include a configuration substantially the same as or similar to the reaction gas supply as described in more detail below. For example, the source gas supply may include a configuration such as a multi-type gas filling tank or a pressurized-type gas filling tank similarly to the reaction gas supply described in more detail below. As an example, the reaction gas supply will be described in more detail below, and duplicative descriptions may be omitted herein.

In an exemplary embodiment of the present inventive concept, the reaction gas supply 110 may include at least one gas filling tank 120a, 120b, 120c charging the reaction gas supplied from a reaction gas supply source 112 to a predetermined charge pressure, and may supply the reaction gas having a pressure greater than the predetermined charge pressure to the process chamber 10. The reaction gas supply may have a configuration of the multi gas filling tank. For example, the reaction gas supply may include the gas filling tanks 120a, 120b, 120c which may be charged and/or discharged sequentially or substantially simultaneously.

The reaction gas supply source 112 may include a bubbler and may supply the reaction gas to the process chamber 10. Examples of the reaction gas may be $B_2H_6$, $Si_2H_6$, $SiH_4$, or $H_2$.

The reaction gas supply 110 may include first to third reaction gas charge distribution lines 113a, 113b, 113c connected in parallel with a charge line 111 connected to the reaction gas supply source 110, first to third gas filling tanks 120a, 120b, 120c connected to the first to third charge distribution lines 113a, 113b, 113c respectively, and first to third discharge distribution lines 115a, 115b, 115c connected in parallel with a reaction gas supply line 117 connected to the process chamber 10. The reaction gas supply line 117 may be connected to the second gas introduction channel 43 of the shower head 40.

The reaction gas supply 110 may further include first to third charge valves 124a, 124b, 124c installed in the first to third charge distribution lines 113a, 113b, 113c respectively to control flowing of the reaction gas into the first to third gas filling tanks 120a, 120b, 120c, and first to third discharge valves 126a, 126b, 126c installed in the first to third discharge distribution lines 115a, 115b, 115c respectively to control flowing of the reaction gas out of the first to third gas filling tanks 120a, 120b, 120c. For example, the gas filling tanks 120a, 120b, 120c which may be charged and/or discharged sequentially or substantially simultaneously, which may be respectively controlled by the first to third discharge valves 126a, 126b, 126c installed in the first to third discharge distribution lines 115a, 115b, 115c respectively.

The reaction gas supply 110 may include a supply control valve 116 installed in the charge line 111 to control flowing of the reaction gas supplied to the first to third gas filling tanks 120a, 120b, 120c, and a second introduction control valve 118 installed in the reaction gas supply line 117 to control flowing of the reaction gas supplied to the process chamber 10.

In an exemplary embodiment of the present inventive concept, the layer deposition apparatus may include a controller 140 for controlling charging and pressurizing the reaction gas of the reaction gas supply 110. The controller 140 may control opening and closing of the supply control valve 116, the second introduction control valve 118, the first to third charge valves 124a, 124b, 124c and the first to third discharge valves 126a, 126b, 126c. The controller 140 may be mechanically and/or electrically connected to the supply control valve 116, the second introduction control valve 118, the first to third charge valves 124a, 124b, 124c and the first to third discharge valves 126a, 126b, 126c. As an example, an electrical on/off signal may be transmitted to the supply control valve 116, the second introduction control valve 118, the first to third charge valves 124a, 124b, 124c and/or the first to third discharge valves 126a, 126b, 126c to open/close the supply control valve 116, the second introduction control valve 118, the first to third charge valves 124a, 124b, 124c and/or the first to third discharge valves 126a, 126b, 126c, as desired.

As an example, the controllers (e.g., 140 and 240) described herein may include a computer having a memory and a processor configured to control operation of valves connected thereto.

At least one second flow controller 114 may be installed in a gas supply line to control a flow rate of the reaction gas supplied into the chamber 20 through the gas supply line (e.g., charge line 111, first to third charge distribution lines 113a, 113b, 113c, reaction gas supply line 117). For example, the second flow controller 114 may include a mass flow controller. The second flow controller 114 may be installed between the reaction gas supply source 112 and the first to third gas filling tanks 120a, 120b, 120c to control a flow rate of the reaction gas. For example, the second flow controller 114 may installed in the charge line 111 or the first to third charge distribution lines 113a, 113b, 113c between the reaction gas supply source 112 and the first to third gas filling tanks 120a, 120b, 120c respectively to control the flow rate of the reaction gas supplied into the chamber 20.

As an example, the first gas filling tank 120a will be described in more detail below. Because the second and third gas filling tanks 120b and 120c, as well as any additional gas filling tanks, are substantially the same as the first gas filling tank, duplicative descriptions may be omitted below.

The first gas filling tank 120a may include a base 121 and a charge chamber 122 (see, e.g., FIG. 3). The charge chamber 122 may extend between a proximal end connected to the base 121 to a distal end of the charge chamber 122. The charge chamber 122 may have a width L and a height d. For example, the charge chamber 122 may be a tube type structure. The charge chamber 122 may include an input port 123 and an output port 125. The first charge valve 124a and the first discharge valve 126a may each be controlled by a controller 240. The controller 240 may control opening and closing of the first charge valve 124a and the first discharge valve 126a. The controller 240 may be mechanically and/or electrically connected to the first charge valve 124a and the first discharge valve 126a. As an example, an electrical on/off signal may be transmitted to the first charge valve 124a and/or the first discharge valve 126a to open/close the first charge valve 124a and/or the first discharge valve 126a, as desired. The second and third gas filling tanks 120b, 120c may have a configuration substantially the same as the first gas filling tank 120a.

Referring to FIG. 4, in a charge step of the first gas filling tank 120a, the first charge valve 124a may be opened and the first discharge valve 126a may be closed. Thus, the charge chamber 122 may be filled with the reaction gas from the reaction gas supply source 112 to have a predetermined charge pressure $P_0$, such as, an upper limit charge pressure. The charge pressure $P_0$ within the charge chamber 122 may be a pressure to which the charge chamber 122 ultimately equilibrates for an exposure time to the flow of the reaction gas from the reaction gas supply source 112.

In a discharge step of the first gas filling tank 120a, the first charge valve 124a may be closed and the first discharge valve 126a may be opened. Thus, the reaction gas may be discharged from the charge chamber 122 to the reaction gas supply line 117, so that the pressure in the charge chamber may be reduced.

In an exemplary embodiment of the present inventive concept, the first to third gas filling tanks 120a, 120b, 120c may be filled with the reaction gas, and then, the reaction gas may be discharged substantially simultaneously or sequentially from the first to third gas filling tanks 120a, 120b, 120c to form a pressure-elevated reaction gas having a pressure greater than the charge pressure $P_0$ and the pressure-elevated reaction gas may be supplied to the process chamber 10.

In the state where the first to third gas filling tanks 120a, 120b, 120c are filled with the reaction gas, when the first to third charge valves 124a, 124b, 124c are closed and the first to third discharge valves 126a, 126b, 126c are opened, the reaction gases from the first to third gas filling tanks 120a, 120b, 120c may be introduced into the reaction gas supply line 117. Then, the second introduction control valve 118 may be opened, and thus, the reaction gases may be supplied to the process chamber 10. Here, because the reaction gases from the first to third gas filling tanks 120a, 120b, 120c are introduced into one reaction gas supply line 117, the pressure of the reaction gas flowing through the reaction gas supply line 117 may have a pressure greater than the charge pressure $P_0$.

Referring to FIG. 5, in a supply step of the reaction gas, when the reaction gases is discharged sequentially from the first to third gas filling tanks 120a, 120b, 120c, a relatively large amount of the reaction gas having the pressure (for example, $3P_0$) greater than the charge pressure $P_0$ may be supplied to the process chamber 10.

Referring to FIG. 6, graph G1 represents a pressure change of the reaction gas supplied through the reaction gas supply line 117 in case of supplying the reaction gas from three gas filling tanks (e.g., $3P_0$), and graph G2 represents a pressure change of the reaction gas in case of supply the reaction gas from one gas filling tank (e.g., $P_0$). The reaction gas in a section A may have a pressure sufficient to reach a bottom surface of an opening having a relatively high aspect ratio, while the reaction gas in a section B may have a pressure insufficient to reach the bottom surface of the opening.

In an exemplary embodiment of the present inventive concept, the layer deposition apparatus may further include a purge gas supply for supplying a purge gas into the process chamber 10. For example, the purge gas may include a nitrogen ($N_2$) gas, or an argon (Ar) gas. The purge gas supply may be substantially the same as or similar to the reaction gas supply and thus duplicative descriptions may be omitted below.

Additionally, the layer deposition apparatus may include a carrier gas supply for supplying a carrier gas together with the reaction gas.

As mentioned above, the layer deposition apparatus may include a plurality of the gas filling tanks 120a, 120b, 120c charging the reaction gas supplied from the reaction gas supply source 112 to a predetermined charge pressure $P_0$, and may collect the reaction gas discharged substantially simultaneously or sequentially from the gas filing tanks 120a, 120b, 120c and supply to the process chamber 10.

Accordingly, as the reaction gas has a pressure greater than the charge pressure $P_0$, the reaction gas may be supplied such that a sufficient amount of the reaction gas reaches the bottom surface of the opening having a relatively high aspect ratio.

According to an exemplary embodiment of the present inventive concept, a deposition method may include positioning the substrate W in the process chamber 10. The method may include charging a plurality of gas filling tanks (e.g., gas filling tanks 120a, 120b or 120c) with a deposition gas. Each of the plurality of gas filling tanks may be charged to a predetermined charge pressure. The method may include elevating a pressure of a first gas filling tank of the plurality of gas filling tanks (e.g., gas filling tank 120a) to a pressure greater than the predetermined charge pressure. The method may include introducing gas from the first gas filing tank of the plurality of gas filling tanks into the process chamber 10. The method may include elevating a pressure of a second gas filling tank of the plurality of gas filling tanks (e.g., gas filling tank 120b) to a pressure greater than the predetermined charge pressure. The method may include introducing gas from the second gas filing tank of the plurality of gas filling tanks into the process chamber 10. The gas from the first gas filing tank of the plurality of gas filling tanks may be introduced into the process chamber 10 at a different time from a time at which the gas from the second gas filling tank of the plurality of gas filling tanks is introduced into the process chamber 10. As an example, the gas may be a source gas, a reaction gas or a purge gas. As an example, the source gas may include a tungsten precursor. As an example, the reaction gas may include boron.

Figure 7:
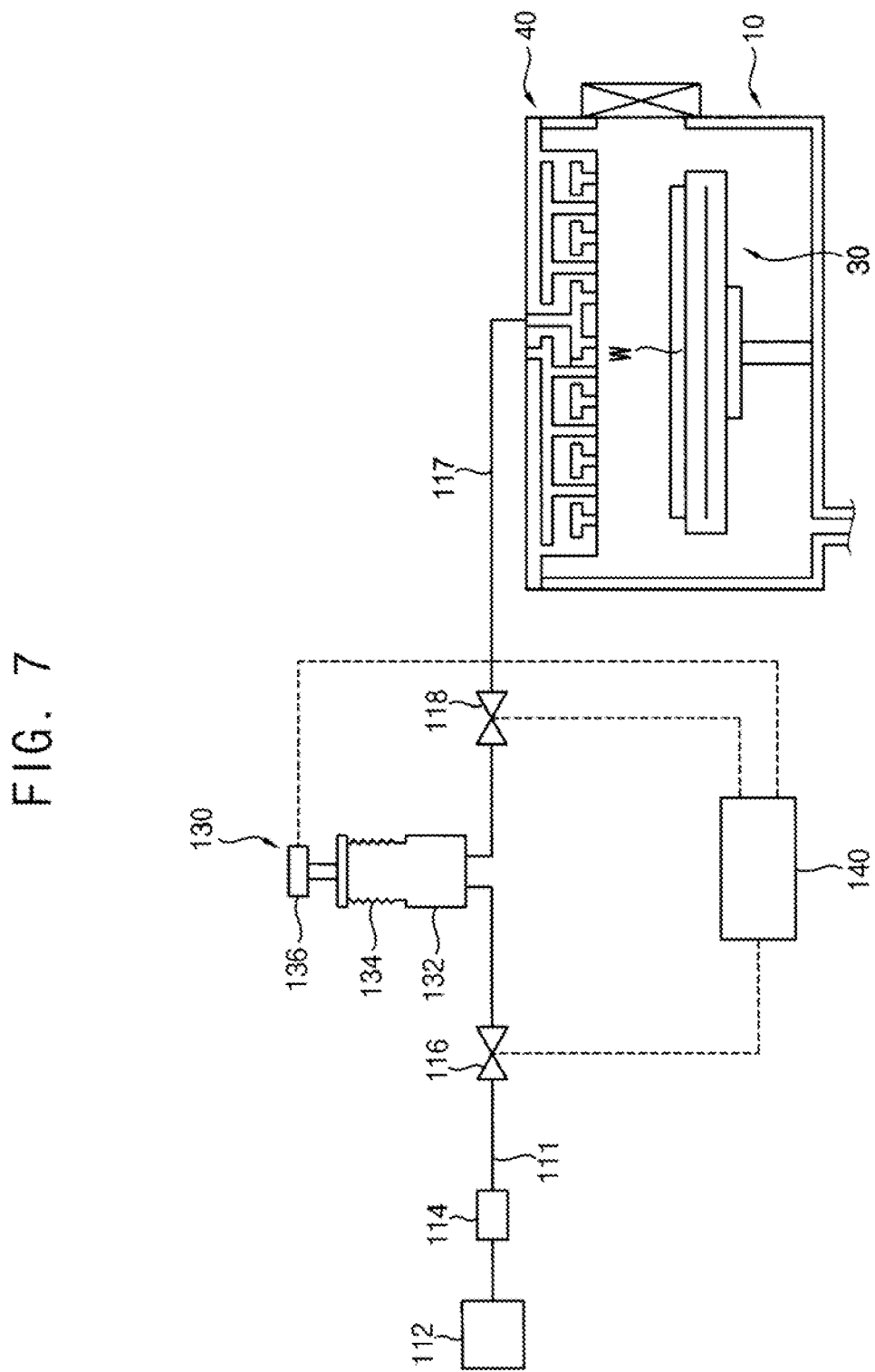
FIG. 7 is a block diagram of a reaction gas supply of a layer deposition apparatus in accordance with an exemplary embodiment of the present inventive concept.
Figure 8:
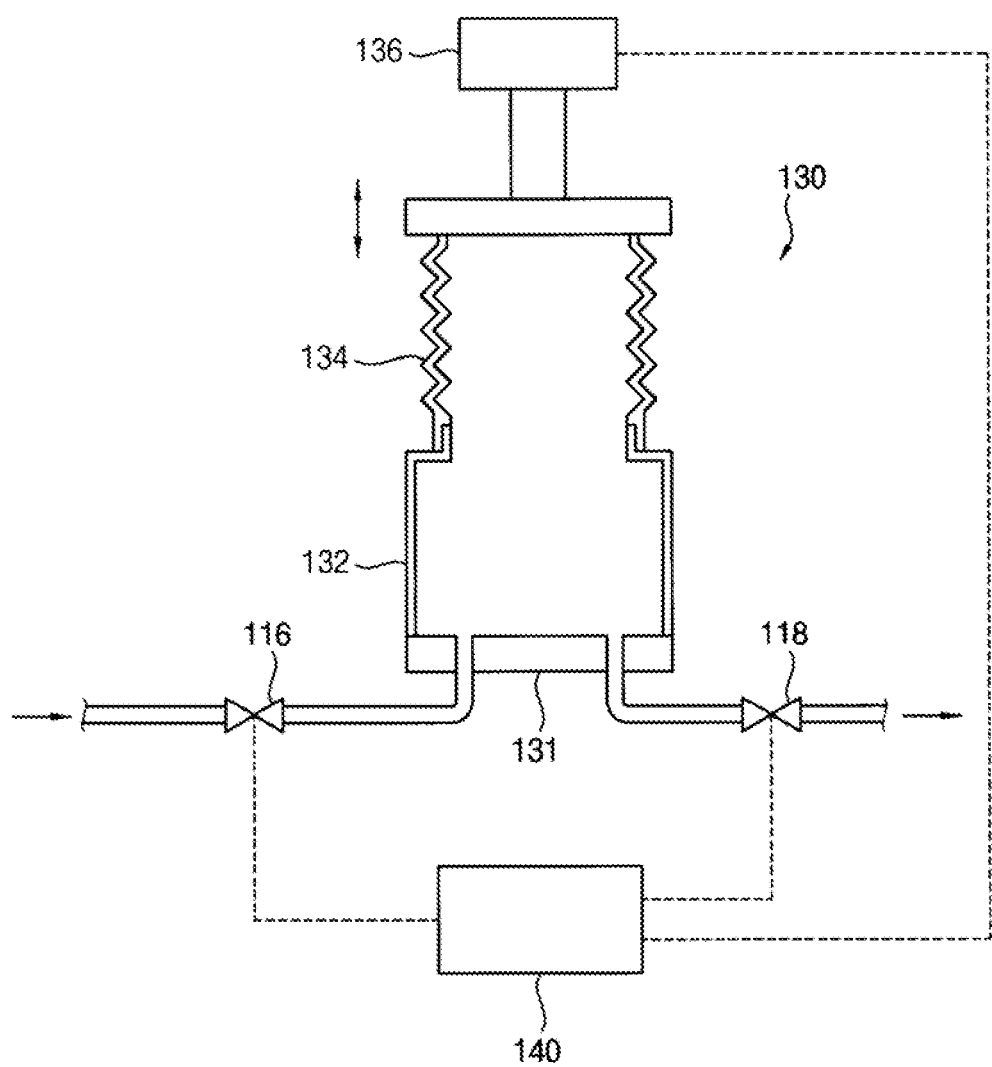
FIG. 8 is a cross-sectional view of a pressurized-type gas filling tank in FIG. 7.

FIG. 7 is a block diagram of a reaction gas supply of a layer deposition apparatus in accordance with an exemplary embodiment of the present inventive concept. FIG. 8 is a cross-sectional view of a pressurized-type gas filling tank in FIG. 7. The layer deposition apparatus may be substantially the same as or similar to the layer deposition apparatus described with reference to FIGS. 1 and 2 except for a configuration of a gas filling tank. Thus, the same reference numerals may refer to the same or like elements and duplicative descriptions may be omitted below.

Referring to FIGS. 7 and 8, a reaction gas supply of a layer deposition apparatus may include a pressurized gas filling tank 130 configured to charge a reaction gas supplied from a reaction gas supply source 112 to a predetermined charge pressure and to supply a pressure-elevated reaction gas having a pressure greater than the predetermined charge pressure to a process chamber 10.

In an exemplary embodiment of the present inventive concept, the pressurized gas filling tank 130 may include a charge chamber 132 charging the reaction gas supplied from a reaction gas supply source 112 to a predetermined charge pressure and a pressurizer configured to pressurize the reaction gas within the charge chamber 132. The pressurizer may include a bellows 134 in communication with the charge chamber 132 to pressurize the reaction gas and an actuator 136 to contract and expand the bellows 134. As an example, the actuator 136 may be a pneumatic actuator. The charge chamber 132 may include a base 131.

The layer deposition apparatus may include a controller 140 configured to control charging and pressure-elevating of the reaction gas. The controller 140 may control opening/closing of a supply control valve 116 and a second introduction control valve 118 and operation of the actuator 136.

In a charge step of the gas filling tank 130, the supply control valve 116 may be opened and the second introduction control 118 may be closed. Thus, the charge chamber 132 may be filled with the reaction gas from a reaction gas supply source 112 to have a predetermined charge pressure $P_0$, such as, an upper limit charge pressure.

In a pressurization step of the gas filling tank 130, in the state where the supply control valve 116 and the second introduction control 118 are closed, the actuator 136 may operate to contract the bellows 134 to increase the pressure of the reaction gas within the gas filling tank 130. The bellows 134 may be contracted until the pressure of the reaction gas reaches a desired pressure.

In a discharge step of the gas filling tank 130, the supply control valve 116 may be closed and the second introduction control 118 may be opened. Thus, the reaction gas may be discharged from the gas filling tank 130 to a reaction gas supply line 117, so that the pressure in the charge chamber 132 may be reduced.

As described above, the layer deposition apparatus may include the pressurized gas filling tank 130 charging the reaction gas supplied from the reaction gas supply source 112 to a predetermined charge pressure $P_0$ and supplying a pressure-elevated reaction gas having a pressure greater than the charge pressure $P_0$ to the process chamber.

Accordingly, as the reaction gas has a pressure greater than the predetermined charge pressure $P_0$, the reaction gas may be supplied such that a sufficient amount of the reaction gas reaches the bottom surface of the opening having a high aspect ratio.

A method of depositing a layer (e.g., using the layer deposition apparatus described above with reference to FIGS. 1 and 7) will be described in more detail below with reference to FIGS. 9, 10A and 10B.

Figure 9:
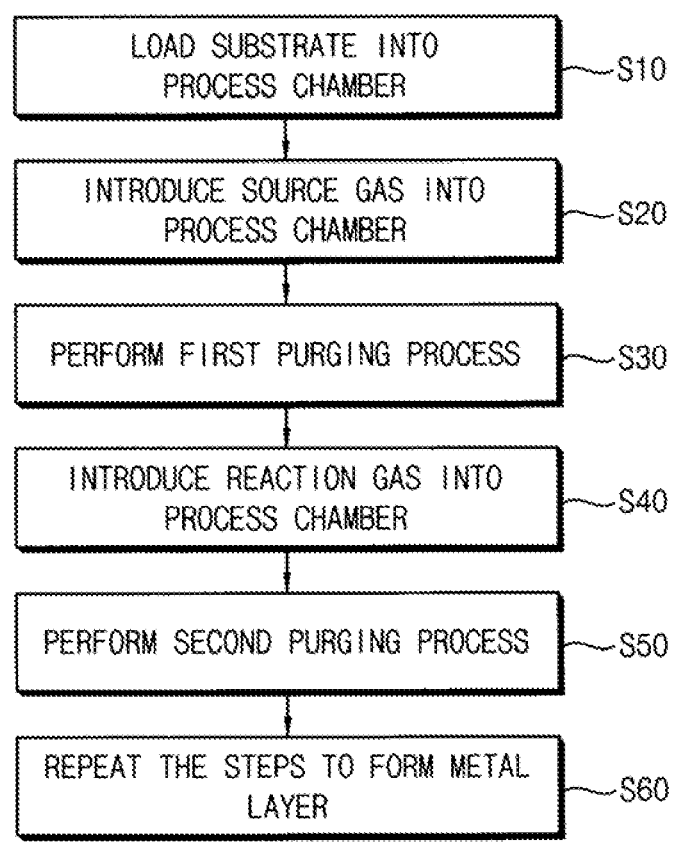
FIG. 9 is a flow chart of a layer deposition method in accordance with an exemplary embodiment of the present inventive concept.

FIG. 9 is a flow chart of a layer deposition method in accordance with an exemplary embodiment of the present inventive concept. FIG. 10A is a flow chart of a source gas supply process of the layer deposition method in FIG. 9. FIG. 10B is a flow chart of a reaction gas supply process of the layer deposition method in FIG. 9. The layer deposition method may be applied for forming a tungsten layer on a wafer by an atomic layer deposition process, however, exemplary embodiments of the present inventive concept are not limited thereto.

Referring to FIGS. 1, 7, 9, 10A and 10B, first, the substrate W may be loaded into the process chamber 10 (S10).

In an exemplary embodiment of the present inventive concept, the process chamber 10 may be used for an ALD process. The substrate W may be an object on which a thin film including tungsten is formed. For example, the substrate W may include a semiconductor wafer such as a silicon wafer or a germanium wafer. Various structures may be further formed on the substrate W.

Then, a source gas may be introduced into the process chamber 10 to form a precursor thin film on the substrate W (S20).

For example, a source gas supply 100 may vaporize a metallic precursor and supply the source gas to the process chamber 10. Examples of the source gas may be $WF_6$, $WCl_6$, $WBr_6$, $W(Co)_6$, $W(C_2H_2)_6$, $W(PF_3)_6$, or $(C_2H_5)WH$.

In the step of S20, at least one gas filling tank 120a, 120b, 120c, 130 may be charged with the source gas (S202). The source gas may be formed to have a pressure greater than a predetermined charge pressure $P_0$ within the gas filling tank. For example, a step of elevating a pressure of the source gas to have a pressure greater than a charge pressure of the gas filling tank (S204) may be performed. Then, the supply source gas may be introduced into the process chamber 10 (S206).

In the state where the first to third gas filling tanks 120a, 120b, 120c are charged with the source gas, the source gases may be discharged substantially simultaneously or sequentially from the first to third gas filling tanks 120a, 120b, 120c to be supplied to the process chamber 10 through a source gas supply line 107. The pressure of the reaction gas flowing through the source gas supply line 107 may have a pressure greater than the charge pressure $P_0$.

The source gas supply 100 may include first to third charge distribution lines 103a, 103b, 103c connected in parallel with the source gas supply line 107 connected to the source gas supply 100. First to third gas filling tanks 120a, 120b, 120c may be connected to the first to third source gas charge distribution lines 103a, 103b, 103c, respectively. First to third source gas discharge distribution lines 105a, 105b, 105c connected in parallel with the source gas supply line 107 connected to the process chamber 10. The source gas supply line 107 may be connected to the first gas introduction channel 42 of the shower head 40.

An introduction control valve 108 may be positioned on the source gas supply line 107 to control flowing of the source gas supplied to the process chamber 10.

The pressurized gas filling tank 130 may be charged with the source gas from the source gas supply source 102 to have a predetermined charge pressure $P_0$, such as, an upper limit charge pressure, and then, the bellows 134 may be contracted to increase the pressure of the source gas within the gas filling tank 130 (see, e.g., FIG. 7). A pressure-elevated reaction gas having the pressure greater than the charge pressure $P_0$ may be supplied to the process chamber.

Then, a first purging process may be performed (S30).

A purge gas supply may supply a first purging gas into the process chamber 10 to remove metallic precursors which physically adhere to or do not adhere to a surface of the substrate W, from the process chamber 10. For example, the first purging gas used in the purging process may include an Ar gas.

Then, a reaction gas may be introduced into the process chamber to change the precursor thin film into a metal layer (S40).

For example, a reaction gas supply 110 may supply the reaction gas as a reducing gas to the process chamber 10. Examples of the reaction gas may be $B_2H_6$, $Si_2H_6$, $SiH_4$, or $H_2$.

In the step of S40, at least one gas filling tank 120a, 120b, 120c, 130 may be charged with the reaction gas (S402). The reaction gas may be formed to have a pressure greater than a predetermined charge pressure $P_0$ within the gas filling tank. For example, a step of elevating a pressure of the reaction gas to have a pressure greater than a charge pressure of the gas filling tank (S404) may be performed. Then, the reaction gas may be introduced into the process chamber 10 (S406).

In the state where the first to third gas filling tanks 120a, 120b, 120c are charged with the reaction gas, the reaction gases may be discharged substantially simultaneously or sequentially from the first to third gas filling tanks 120a, 120b, 120c to be supplied to the process chamber 10 through the reaction gas supply line 117. The pressure of the reaction gas flowing through the reaction gas supply line 117 may have a pressure greater than the charge pressure $P_0$.

The pressurized gas filling tank 130 may be charged with the source gas from the reaction gas supply source 112 to have a predetermined charge pressure $P_0$, such as, an upper limit charge pressure, and then, the bellows 134 may be contracted to increase the pressure of the reaction gas within the gas filling tank 130 (see, e.g., FIG. 7). A pressure-elevated reaction gas having the pressure greater than the charge pressure $P_0$ may be supplied to the process chamber.

The reducing gas such as $B_2H_6$ may be decomposed before the reducing gas reaches a bottom surface of an opening having a high aspect ratio. Thus, step coverage of the tungsten thin film may be deteriorated. However, in an exemplary embodiment of the present inventive concept, as the reducing gas has a pressure greater than the predetermined discharge pressure $P_0$, a relatively large amount of the reaction gas may be supplied sufficiently to the bottom surface of the opening to thus prevent the gas from being decomposed. Thus, step coverage characteristics of the tungsten thin film and UPEH (Unit Per Equipment Hour) may be increased.

Then, a second purging process may be performed (S50).

The purge gas supply may supply a second purging gas into the process chamber 10 to remove reaction materials remaining within the process chamber 10.

Then, the steps of S20 to S50 may be repeated with a plurality of cycles, to form a metal layer (S60) having a desired thickness.

The source gas or the reaction gas may be supplied to the process chamber using a gas supply having the multi-type gas filling tank or pressurized-type gas filling tank configuration, however, exemplary embodiments of the present inventive concept are not limited thereto. For example, as described below, it may be understood that a reducing gas for forming a tungsten nucleation layer may be supplied to the process chamber using the gas supply having the multi-type gas filling tank or pressurized-type gas filling tank configuration.

A method of manufacturing a semiconductor device (e.g., using the layer deposition method described herein) will be described in more detail below.

FIGS. 11 to 15 are cross-sectional views of a method of manufacturing a semiconductor device in accordance with an exemplary embodiment of the present inventive concept. For example, FIGS. 11 to 15 illustrate a method of forming a conductive structure of the semiconductor device using the layer deposition method in accordance with an exemplary embodiment of the present inventive concept.

Figure 11:
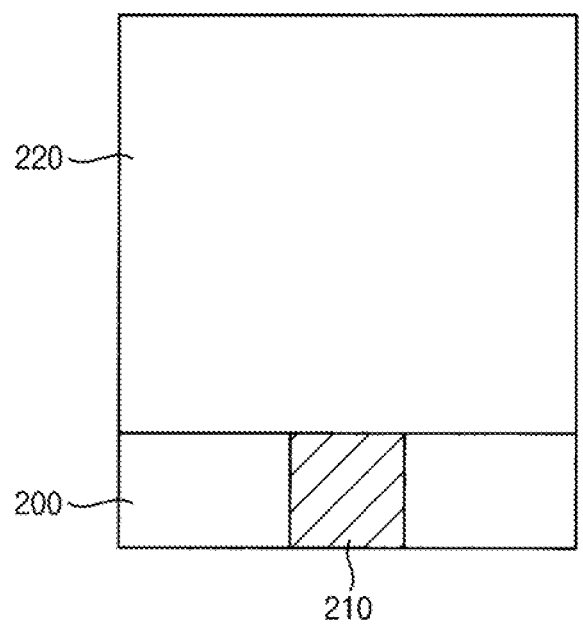
FIGS. 11 to 15 are cross-sectional views of a method of manufacturing a semiconductor device in accordance with an exemplary embodiment of the present inventive concept.

Referring to FIG. 11 an interlayer insulation layer 220 may be formed on a lower structure 200 including a conductive pattern 210 formed therein.

In an exemplary embodiment of the present inventive concept, the lower structure 200 may include a lower insulation layer formed on the substrate W (see, e.g., FIG. 2). A circuit element including a word line, a gate structure, a diode, a source/drain layer, a contact, or a wiring may be formed on the substrate W.

The lower structure 200 may be formed on the substrate W to cover the circuit element. The conductive pattern 210 may be formed in the lower structure 200. The conductive pattern 210 may function as a plug to be electrically connected to at least a portion of the circuit element.

For example, the lower structure 200 may be formed through a CVD process to include a silicon-oxide-based material. The conductive pattern 210 may include a metal such as tungsten (W), copper (Cu), titanium (Ti), or tantalum (Ta), metal nitride, metal silicide and/or polysilicon doped with impurities.

In an exemplary embodiment of the present inventive concept, the lower structure 200 may include a semiconductor substrate. For example, the lower structure 200 may include silicon, germanium, silicon-germanium or a III-V group compound such as GaP, GaAs, GaSb or the like. In an exemplary embodiment of the present inventive concept, the lower structure 200 may include a silicon-on-insulator (SOI) substrate or a germanium-on-insulator (GOI) substrate. The conductive pattern 210 may be an impurity region of n-type or p-type, which is formed in the lower structure 200.

The interlayer insulation layer 220 may include the silicon-oxide-based material or a low dielectric organic oxide. For example, the interlayer insulation layer 220 may be formed through a CVD process or a spin coating process.

Figure 12:
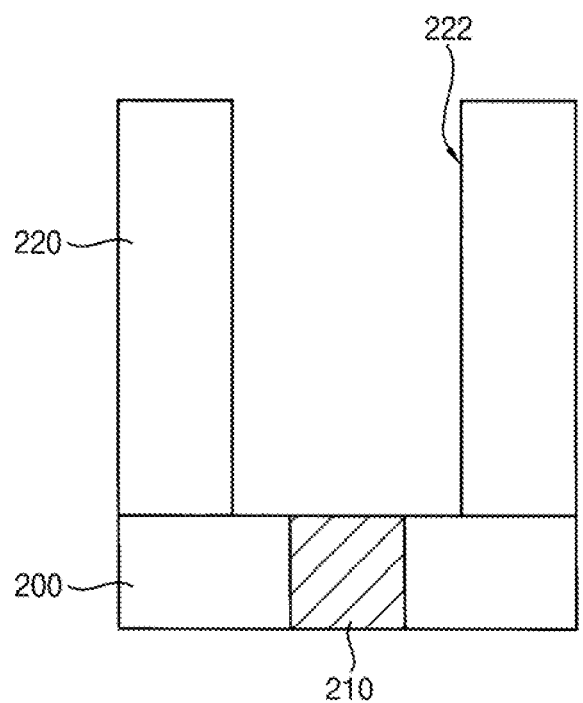

Referring to FIG. 12, the interlayer insulation layer 220 may be partially removed to form an opening 222 partially exposing at least a portion of the conductive pattern 210.

In an exemplary embodiment of the present inventive concept, the opening 222 may have a shape of a hole entirely exposing an upper surface of the conductive pattern 210. In an exemplary embodiment of the present inventive concept, the opening 222 may have a shape of a trench exposing the upper surface of the conductive pattern 210 and extending linearly.

Figure 13:
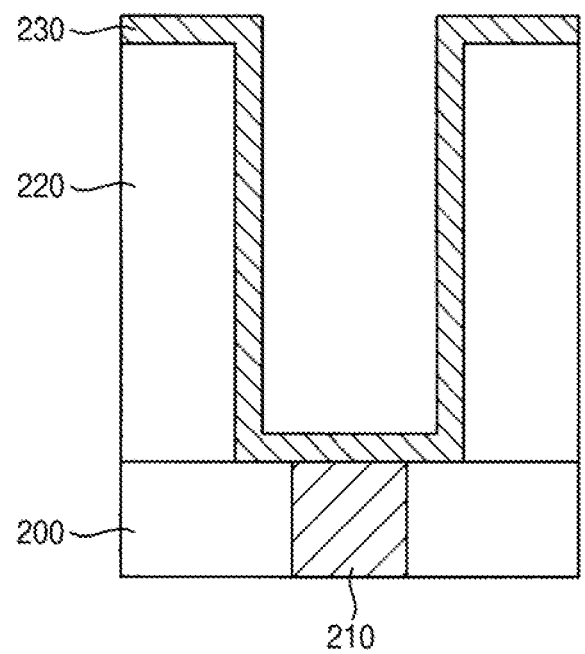

Referring to FIG. 13, a barrier conductive layer 230 may be formed along a surface of the interlayer insulation layer 220 and a sidewall and a bottom surface of the opening 222. The barrier conductive layer 230 may also be disposed on an upper surface of the interlayer insulation layer 220 facing away from the lower structure 200.

In an exemplary embodiment of the present inventive concept, the barrier conductive layer 230 may be formed by an ALD process or a plasma enhanced ALD (PEALD) process using a metallic precursor. For example, the barrier conductive layer 230 may be formed to include tungsten nitride, tungsten carbide or tungsten carbonitride.

Figure 14:
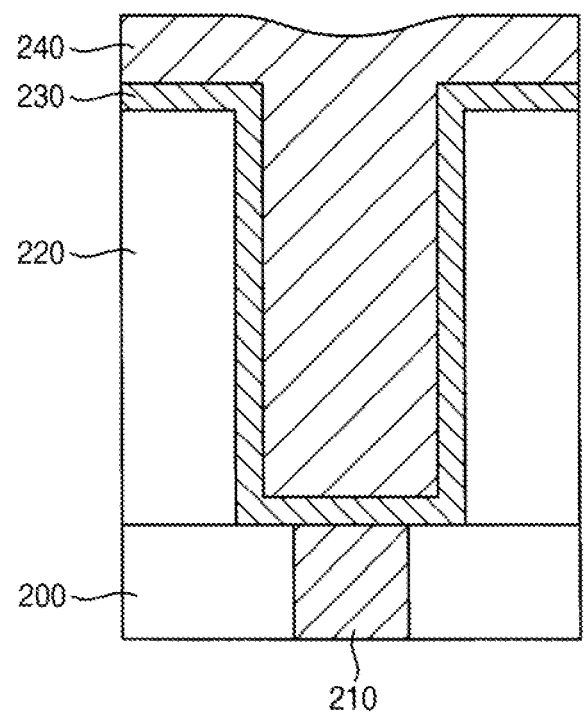

Referring to FIG. 14, a metal layer 240 may be formed on the barrier conductive layer 230. The metal layer 240 may substantially fill the opening 222, and may also be formed on an upper surface of the barrier conductive layer 230 facing away from the lower structure 200.

In an exemplary embodiment of the present inventive concept, the metal layer 240 may be formed using the layer deposition method (e.g., a method described with reference to FIGS. 9 and 10).

Figure 10A:
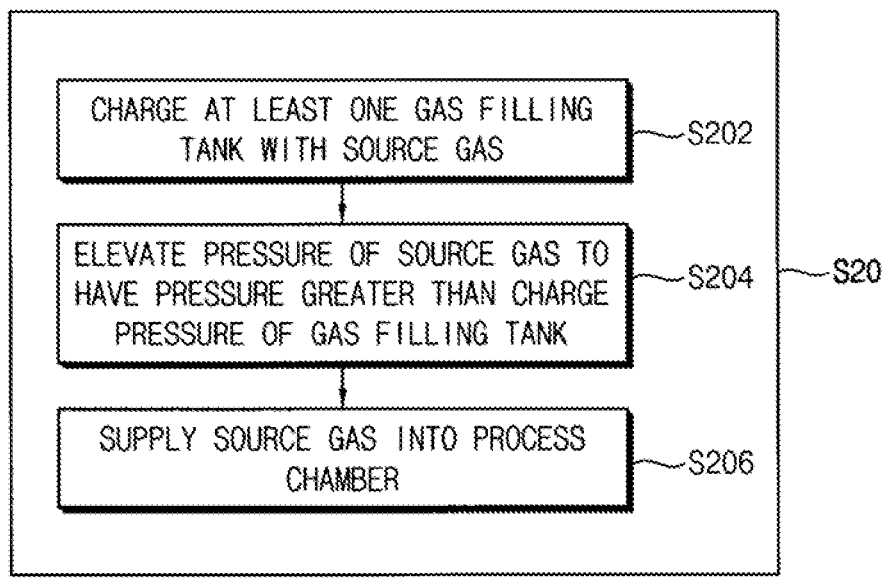
FIG. 10A is a flow chart of a source gas supply process of the layer deposition method in FIG. 9.
Figure 10B:
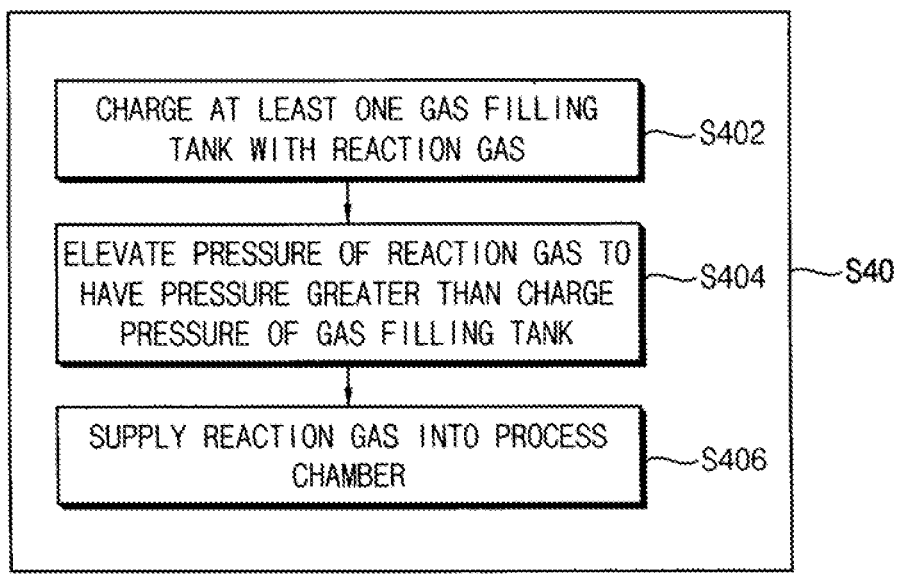
FIG. 10B is a flow chart of a reaction gas supply process of the layer deposition method in FIG. 9.

Referring to FIGS. 9, 10A and 10B, a deposition cycle of a source gas supply process, a first purging process, a reaction gas supply process and a second purging process may be performed repeatedly to form a metal layer having a desired thickness. For example, $WF_6$ may be used as a source gas and $B_2H_6$ may be used as a reaction gas to form a tungsten thin film.

In this case, the barrier conductive layer 230 and the metal layer 240 may be deposited in-situ in a same vapor deposition chamber.

Figure 15:
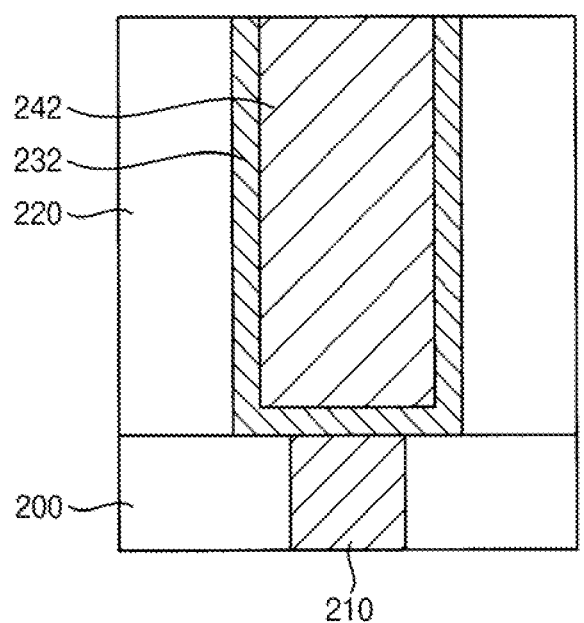

Referring to FIG. 15, an upper portion of the metal layer 240 and the barrier conductive layer 230 may be planarized, for example, by a chemical mechanical polishing (CMP) process until an upper surface of the interlayer insulation layer 220 is exposed.

A conductive structure electrically connected to the conductive pattern 210 and including a barrier conductive pattern 232 and a metal filling pattern 242 may be formed in the opening 222 (e.g., through the above described planarization process). In an exemplary embodiment of the present inventive concept, the conductive structure may include a stacked structure of tungsten nitride/tungsten (WNx/W).

In an exemplary embodiment of the present inventive concept, after forming the barrier conductive layer 230, a pre-treatment process may be performed. The pre-treatment process may be performed using the reaction gas supply process of the layer deposition method (e.g., as described with reference to FIGS. 10A and 10B).

For example, $B_2H_6$ may be supplied as a reaction gas onto the substrate W having the barrier conductive layer 230 formed thereon. The reaction gas may be supplied using a reaction gas supply having a multi gas filling tank or pressurized gas filling tank configuration to form a nucleation layer. The $B_2H_6$ reaction gas may be decomposed into boron or boron hydride and then absorbed on the substrate surface, resulting in a relatively rapid nucleation rate of the tungsten thin film.

FIGS. 16 to 22 are cross-sectional views of a method of manufacturing a semiconductor device in accordance with an exemplary embodiment of the present inventive concept. For example, FIGS. 16 to 22 may illustrate a method of manufacturing a non-volatile semiconductor device having a 3-dimensional structure or a vertical type memory device including a vertical channel.

In FIGS. 16 to 22, a direction vertically extending from an upper surface of a substrate may be defined as a first direction. Furthermore, two directions that are parallel with the upper surface of the substrate and cross each other may be defined as a second direction and a third direction, respectively. For example, the second direction and third direction may cross each other perpendicularly. Thus, the first direction may be orthogonal to the second and third directions. The second and third directions may define a plane along which a substrate (e.g., substrate W or substrate 300) extends.

Figure 16:
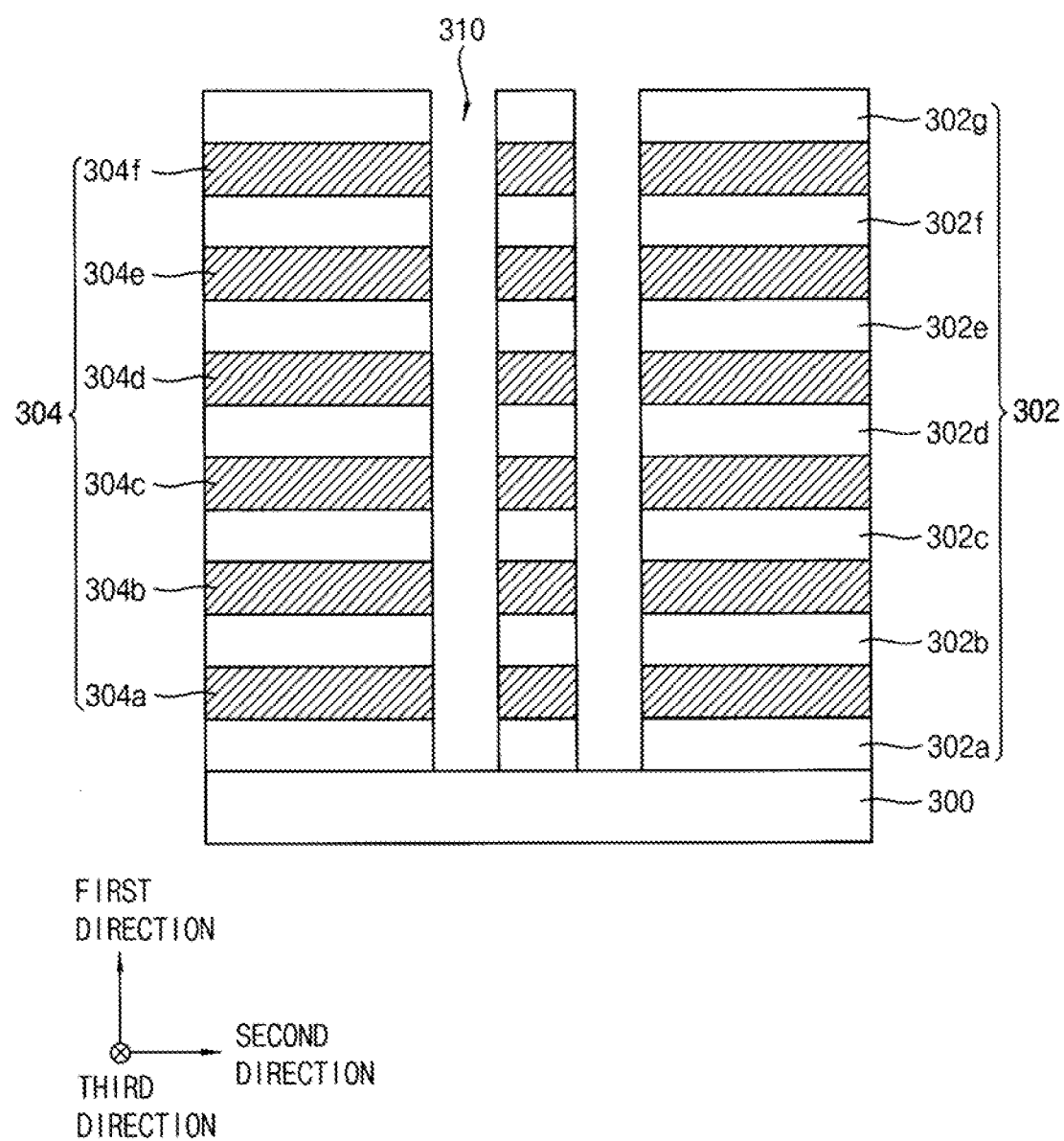

Referring to FIG. 16, interlayer insulation layers 302 (e.g., 302a, 302b, 302c, 302d, 302e, 302f and 302g) and sacrificial layers 304 (e.g., 304a, 304b, 304c, 304d and 304f) may be alternately and repeatedly formed on a substrate 300 to form a mold structure. The mold structure may be partially etched to form channel holes 310 exposing an upper surface of the substrate 300.

For example, the interlayer insulation layers 302 may include silicon oxide. The sacrificial layers 304 may include a material that may have an etching selectivity with respect to the interlayer insulation layers 302 and may be relatively easily removed through a wet etching process. For example, the sacrificial layer 304 may include silicon nitride.

The sacrificial layers 304 may be removed in a subsequent process to provide spaces for a ground selection line (GSL), a word line and a string selection line (SSL). Thus, the number of the interlayer insulation layers 302 and the sacrificial layers 304 may be determined in consideration of the number of the GSL, the word line and the SSL.

For example, each of the GSL and the SSL may be formed at a single level, and the word line may be formed at 4 levels. In this case, the sacrificial layers 304 and the interlayer insulation layers 302 are formed at 6 levels and 7 levels, respectively. However, the number of the interlayer insulation layers 302 and the sacrificial layers 304 are not specifically limited thereto according to exemplary embodiments of the present inventive concept, and the number of the interlayer insulation layers 302 and the sacrificial layers 304 may increase or decrease depending on degree of integration of the semiconductor device.

For example, the mold structure may be partially removed through a dry etching process to form a plurality of channel holes 310. The channel holes 310 may form a channel hole row along the third direction. Additionally, the channel holes 310 may form a channel hole row along the second direction.

Figure 17:
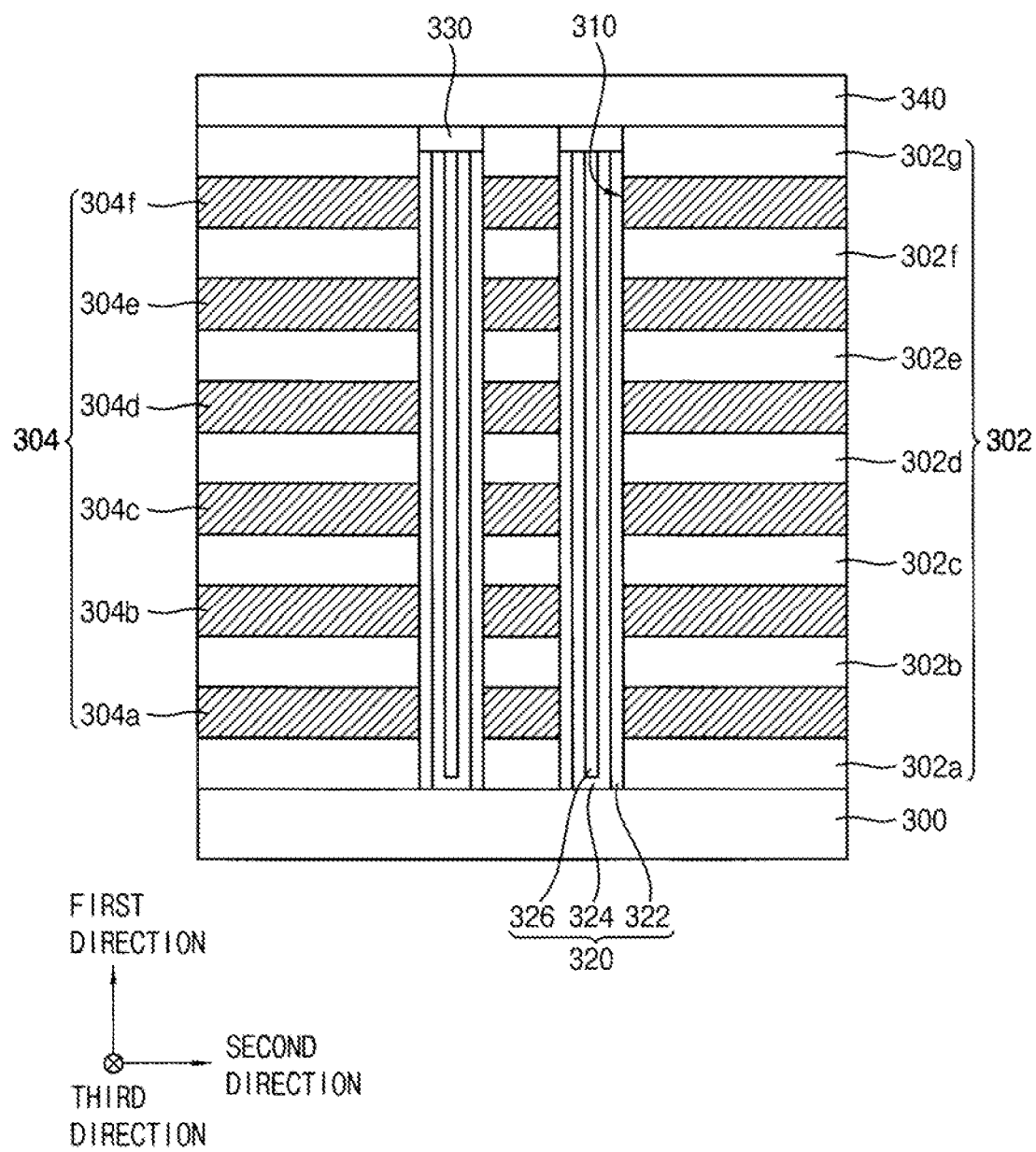

Referring to FIG. 17, a vertical channel structure 320 including a dielectric layer structure 322, a channel 324 and a filling pattern 326 may be formed in each of the channel holes 310. A capping pad 330 may be formed on the vertical channel structure 320.

For example, a dielectric layer may be formed along a sidewall and a bottom surface of the channel holes 310 and an upper surface of the uppermost interlayer insulation layer 302g. For example, a blocking layer, a charge trap layer and a tunnel insulation layer may be sequentially formed to form the dielectric layer.

For example, the blocking layer may be formed by using an oxide, such as silicon oxide, the charge trap layer may be formed by using silicon nitride or a metal oxide, and the tunnel insulation layer may be formed by using an oxide such as silicon oxide. For example, the dielectric layer may be formed to have an ONO-layered structure.

For example, upper and lower portions of the dielectric layer may be removed through an etch-back process. Thus, portions of the dielectric layer formed on the upper surfaces of the uppermost interlayer insulation layer 302g and the substrate 300 may be substantially removed to form the dielectric layer structure 322. For example, the dielectric layer structure 322 may be formed at the sidewall of the channel hole 310, and may have a substantially pillar (e.g., rectangular) shape or a substantially cylindrical shape.

A channel layer may be formed on surfaces of the uppermost interlayer insulation layer 302g and the dielectric layer structures 322, and the upper surface of the substrate 300. A filling layer may be formed on the channel layer to fill remaining portions of the channel holes 310.

In an exemplary embodiment of the present inventive concept, the channel layer may be formed to include polysilicon or amorphous silicon optionally doped with impurities. In an exemplary embodiment of the present inventive concept, a heat treatment or a laser beam irradiation may be further performed on the channel layer to change polysilicon or amorphous silicon of the channel layer into single crystalline silicon. The filling layer may be formed by using an insulation material such as silicon oxide or silicon nitride.

The filling layer and the channel layer may be planarized, for example, through a CMP process and/or an etch-back process until the uppermost interlayer insulation layer 302g is exposed. Accordingly, a channel 324 and a filling pattern 326 sequentially stacked from an inner wall of the dielectric layer structure 322 may be formed to fill the channel hole 310.

The channel 324 may have a substantially cup shape (e.g., a 'C' shape), and may be in direct contact with the upper surface of the substrate 300 exposed through the channel hole 310. The filling pattern 326 may have a substantially pillar (e.g., rectangular) shape or a solid cylindrical shape.

The channel 324 may be formed in each channel hole 310, and thus a channel row similar to the channel hole row may be formed.

A capping pad 330 capping an upper portion of the channel hole 310 may be further formed on the vertical channel structure 320. For example, upper portions of the dielectric layer structure 322, the channel 324 and the filling pattern 326 may be partially removed through an etch-back process to form a recess. A pad layer may be formed on the uppermost interlayer insulation layer 302g to fill the recess. An upper portion of the pad layer may be planarized, for example, through a CMP process, until the upper surface of the uppermost interlayer insulation layer 302g is exposed, to form the capping pad 330. In an exemplary embodiment of the present inventive concept, the pad layer may be formed by using polysilicon optionally doped with n-type impurities.

A first upper insulation layer 340 may be formed on the uppermost interlayer insulation layer 302g to substantially cover the capping pads 330. The first upper insulation layer 340 may be in direct contact with an upper surface of the capping pads 330 facing away from the substrate 300. For example, the first upper insulation layer 340 may be formed through a CVD process, or a spin coating process, and may include silicon oxide.

Figure 18:
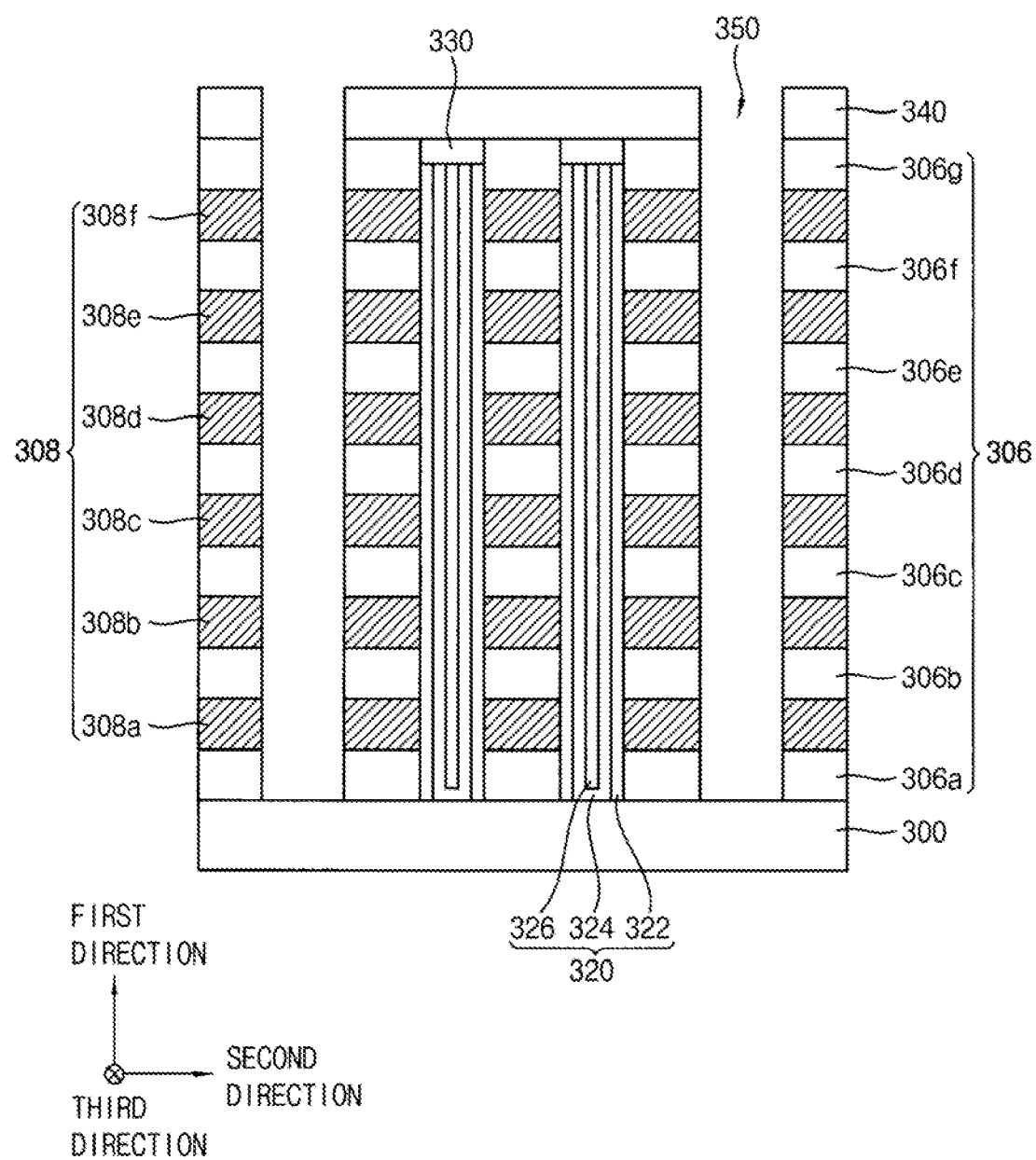

Referring to FIG. 18, the first upper insulation layer 340 and the mold structure may be partially etched to form an opening 350. For example, portions of the first upper insulation layer 340 and the mold structure between channel rows adjacent to each other may be etched through a dry etching process to form the opening 350.

The opening 350 may pass through the mold structure along the first direction to expose the upper surface of the substrate 300. Furthermore, the opening 350 may extend along the third direction, and a plurality of openings 350 may be formed and arranged along the second direction.

The opening 350 may be provided as a gate line cut region. The predetermined number of the channel rows may be arranged between the openings 350 adjacent to each other along the second direction.

As the openings 350 are formed, the interlayer insulation layers 302 and the sacrificial layers 304 may be changed into interlayer insulation patterns 306 (e.g., 306a, 306b, 306c, 306d, 306e, 306f and 306g) and sacrificial patterns 308 (e.g., 308a, 308b, 308c, 308d, 308e and 308f). The interlayer insulation layer patterns 306 and the sacrificial patterns 308 at each level may have a plate shape surrounding the vertical channel structures 320 included in the channel rows and extending in a direction.

Figure 19:
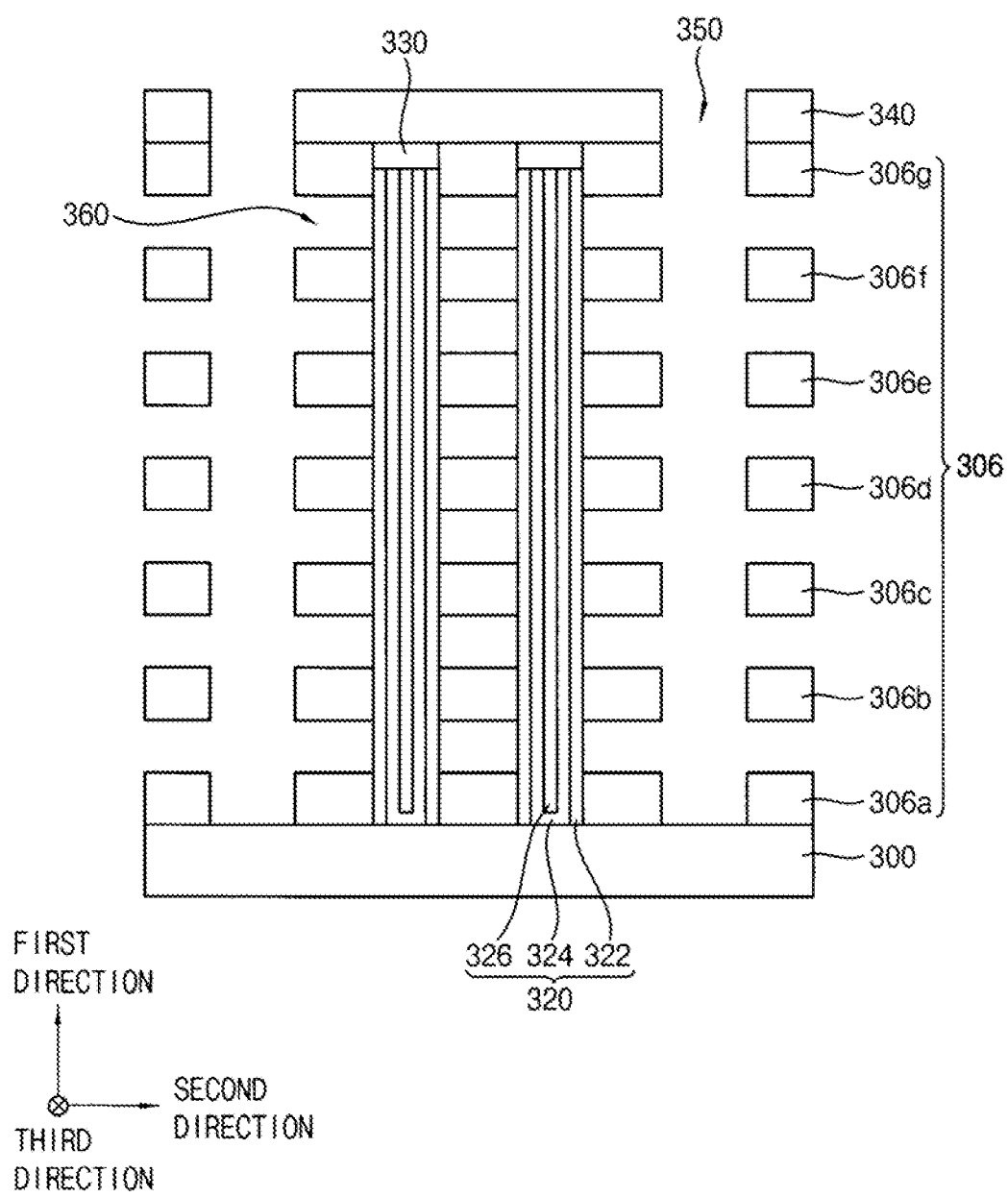

Referring to FIG. 19, the sacrificial patterns 308, of which the sidewalls are exposed by the opening 350, may be removed.

When the sacrificial patterns 308 include silicon nitride, and when the interlayer insulation patterns 306 include silicon oxide, the sacrificial patterns 308 may be removed through a wet etching process using an etchant solution having selectivity with respect to silicon nitride, for example, phosphoric acid.

A gap 360 may be defined by a space from which the sacrificial patterns 308 are removed. A plurality of the gaps 360 may be formed between the adjacent interlayer insulation layer patterns 306. An outer sidewall of the dielectric layer structure 322 may be exposed by the gaps 360.

Figure 20:
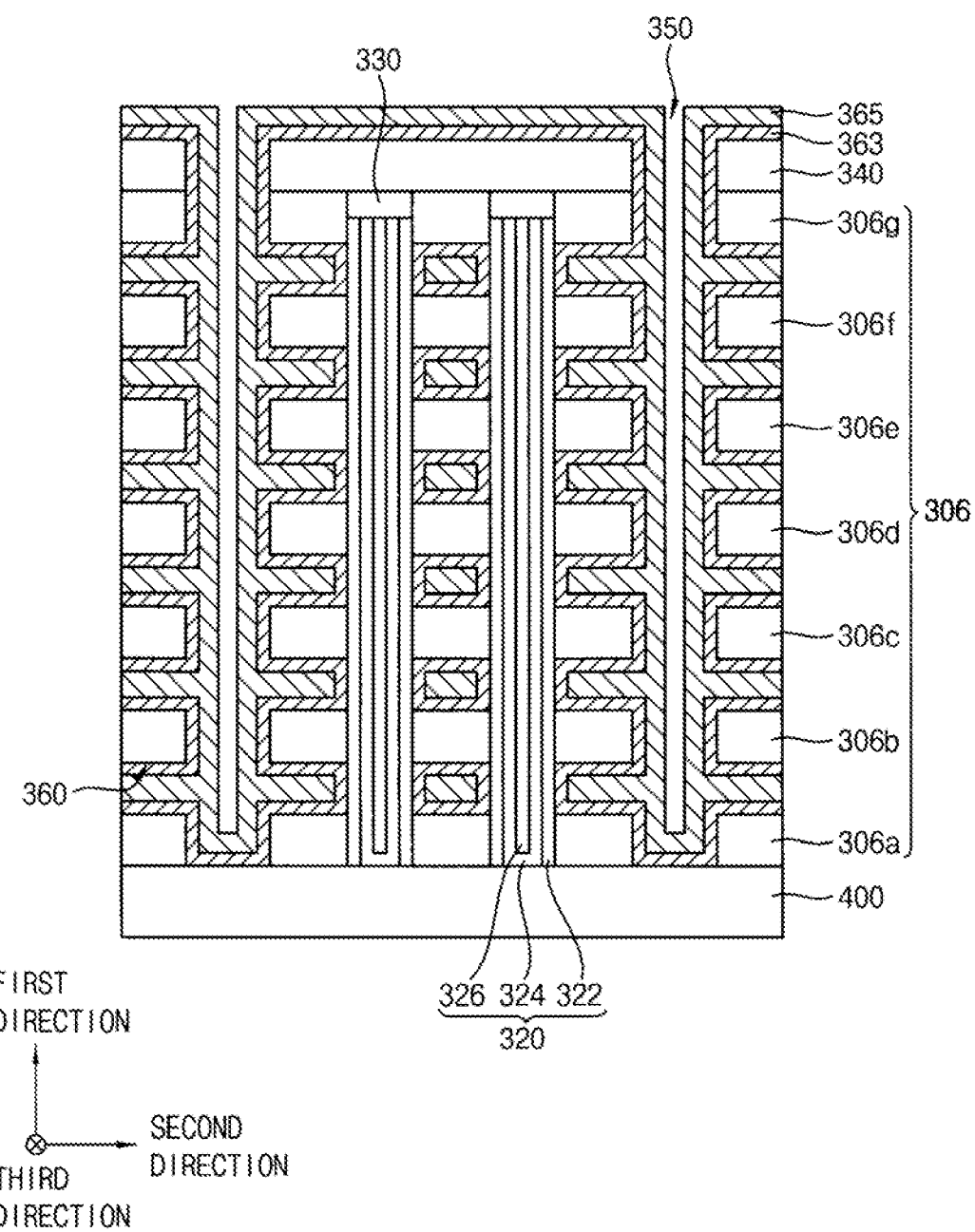

Referring to FIG. 20, a barrier conductive layer 363 may be formed along the exposed outer sidewall of the dielectric layer structure 322, an inner wall of the gap 360, a surface of the interlayer insulation layer pattern 306, and the exposed upper surface of the substrate 300. A metal gate layer 365 may be formed on the barrier conductive layer 363. In an exemplary embodiment of the present inventive concept, the metal gate layer 365 may substantially fill the gap 360, and may at least partially fill the opening 350. Thus, an open space may remain in a portion of the opening 350 not filled with the metal gate layer 365.

For example, the barrier conductive layer 363 may be formed by an ALD process or a plasma enhanced ALD (PEALD) process using an metallic precursor. For example, the barrier conductive layer 363 may be formed to include tungsten nitride, tungsten carbide or tungsten carbonitride.

In an exemplary embodiment of the present inventive concept, a reaction gas such as $B_2H_6$ may be supplied onto the substrate W having the barrier conductive layer 363 formed thereon, to form a nucleation layer. The reaction gas may be supplied using a reaction gas supply having a multi gas filling tank or pressurized gas filling tank configuration (e.g., as described with reference to FIGS. 1 to 9, 10A and 10B). The $B_2H_6$ reaction gas may be decomposed into boron or boron hydride and then absorbed on the substrate surface, resulting in a relatively rapid nucleation rate of a tungsten thin film.

The opening 350 may have a relatively high aspect ratio according to the degree of integration of the semiconductor device. The reducing gas such as $B_2H_6$ may be decomposed before the reducing gas reaches a bottom surface of the opening 350 having a relatively high aspect ratio. Thus, step coverage of the tungsten thin film may be deteriorated. However, in an exemplary embodiment of the present inventive concept, as the reducing gas has a pressure greater than the discharge pressure $P_0$, a relatively large amount of the reaction gas may be supplied into the gap 360 adjacent to the bottom surface of the opening 350.

Then, the metal gate layer 365 may be formed on the barrier conductive layer 363, such as by using the layer deposition method described with reference to FIGS. 9, 10A and 10B.

Referring to FIGS. 9, 10A and 10B, a deposition cycle of a source gas supply process, a first purging process, a reaction gas supply process and a second purging process may be performed repeatedly to form a metal layer having a desired thickness. For example, $WF_6$ may be used as a source gas and $B_2H_6$ may be used as a reaction gas to form a tungsten thin film.

Figure 21:
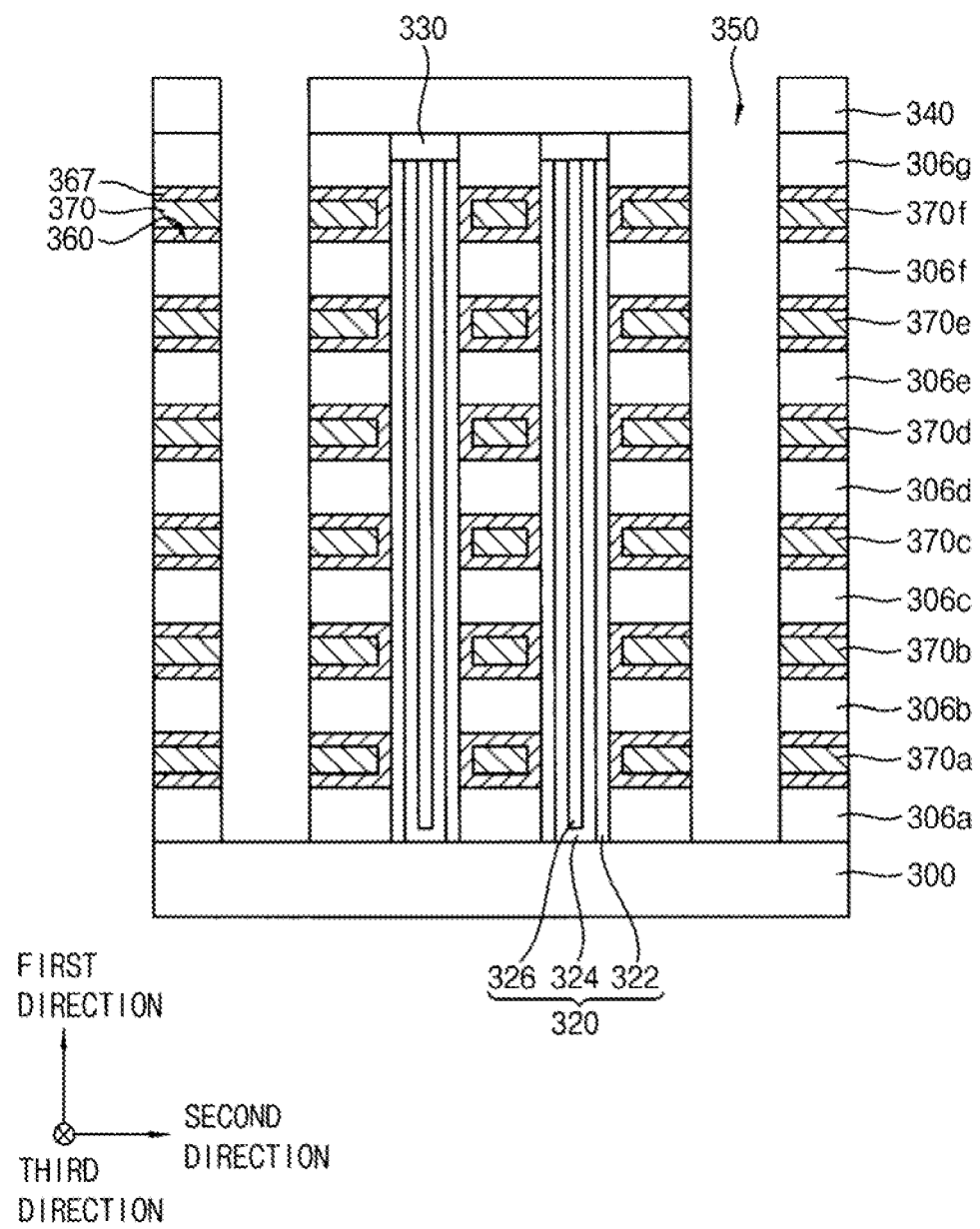

Referring to FIG. 21, the barrier conductive layer 363 and the metal gate layer 365 may be partially etched to form a barrier conducive pattern 367 and a metal gate 370 (e.g., 370a, 370b, 370c, 370d, 370e and 370f) in each of the gaps 360. The metal gate 370 may have a linear shape or a plate shape. The metal gate 370 may surround sidewalls of the vertical channel structures 320 included in the channel rows.

For example, upper portions of the barrier conductive layer 363 and the metal gate layer 365 may be planarized through a CMP process until an upper surface of the first upper insulation layer 340 may be exposed. Thereafter, portions of the barrier conductive layer 363 and the metal gate layer 365 formed in the opening 350 may be etched through an anisotropic etching process to form the barrier conductive pattern 363 and the metal gate 370 in the gap 360 at each levels. The barrier conductive pattern 367 may be formed along the inner wall of the gap 360, and the metal gate 370 may be formed on the barrier conductive pattern 367 to fill the gap 360 at each levels.

The metal gates 370 may include a GSL, a word line and a SSL sequentially stacked from the upper surface of the substrate 300 and spaced apart from one another along the first direction. For example, a lowermost metal gate 370a may be the GSL. The four metal gates 370b, 370c, 370d and 370e on the GSL may be the word line. An uppermost metal gate 370f on the word line may be the SSL.

Referring to FIG. 22, an impurity region 305 may be formed on the substrate 300 exposed by the opening 350, and a spacer 380 and a cutting pattern 385 may be formed in the opening 350.

For example, n-typed impurities such as phosphor or arsenic may be provided through the opening 350, for example, by an ion implantation process to form the impurity region 305. The impurity region 305 may be formed on the substrate 300 and may extend along the third direction. The impurity region 305 may be in direct contact with the substrate 300. The impurity region 305 may be positioned below an uppermost surface of the substrate 300.

The spacer 380 may be formed at the sidewall of the opening 350. For example, a spacer layer including an insulation material such as silicon oxide may formed along the upper surface of the first upper insulation layer 340 and the sidewall and the bottom surface of the opening 350 through an ALD process. For example, the spacer layer may be partially removed through an anisotropic etching process or an etch-back process to selectively form the spacer 380 at the sidewall of the opening 350.

Thereafter, the cutting pattern 385 may be formed to fill a remaining portion of the opening 350. For example, a conductive layer may be formed on the first upper insulation layer 340 to substantially fill an open portion of the opening 350. An upper portion of the conductive layer may be planarized through a CMP process, until the upper surface of the first upper insulation layer 340 is exposed, to form the cutting pattern 385 extending in the opening 350.

The conductive layer may include a metal, a metal nitride, a metal silicide and/or polysilicon doped with impurities, and may be formed through an ALD process or a sputtering process. The cutting pattern 385 may be provided as a CSL of the semiconductor device.

In an exemplary embodiment of the present inventive concept, the conductive layer may be formed by using a metallic precursor according to an exemplary embodiment of the present inventive concept. In this case, the cutting pattern 385 may include tungsten.

A second upper insulation layer 390 may be formed on the first upper insulation layer 340 to cover the cutting pattern 385 and the spacer 380. The second upper insulation layer 390 may be in direct contact with an upper surface of the cutting pattern 385 facing away from the substrate 300. The second upper insulation layer 390 may include silicon oxide. The second upper insulation layer 390 may include a same material as the first upper insulation layer 340, and may be formed through a CVD process.

A bit line contact 395 may be formed. The bit line contact 395 may pass through the first and second upper insulation layers 340 and 390 to be in direct contact with the capping pad 330. A bit line 397 electrically connected to the bit line contact 395 may be formed on the second upper insulation layer 390. The bit line contact 395 and the bit line 397 may include a metal, a metal nitride, or polysilicon doped with impurities, and may be formed through a CVD process, an ALD process, or a sputtering process.

A plurality of the bit line contacts 395 may be formed in a position corresponding to the capping pad 330 thus forming a bit line contact array. For example, the bit line contacts 395 may be respectively disposed directly on upper surfaces of the capping pads 330 facing away from the substrate 300.

The bit line 397 may extend along the second direction, and may be electrically connected to a plurality of the capping pads 330 through the bit line contact 395. As an example, a plurality of the bit lines 397 may be formed along the third direction.

The layer deposition apparatus and the layer deposition method according to an exemplary embodiment of the present inventive concept may be used for forming a conductive structure such as a gate pattern of a flash memory device. The layer deposition apparatus and the layer deposition method according to an exemplary embodiment of the present inventive concept may be used for forming an electrode, a gate, or a contact for various semiconductor devices such as an MRAM device, an ReRAM device, a PRAM device, or a login element.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A layer deposition method, comprising:
   loading a substrate into a process chamber;
   charging a plurality of gas filling tanks with a gas to a predetermined charge pressure, wherein the gas is supplied from a gas supply source;
   elevating the pressure of the gas to a pressure greater than the predetermined charge pressure by discharging the gas from the plurality of gas filling tanks into a supply line prior to a closed introduction control valve, wherein the pressure-elevated gas consists of the gas supplied from the gas supply source; and
   introducing the pressure-elevated gas into the process chamber from the supply line.

2. The layer deposition method of claim 1, further comprising, prior to charging the plurality of gas filling tanks, introducing a source gas into the process chamber, and wherein the gas is a reaction gas.

3. The layer deposition method of claim 1, wherein a plurality of discharge distribution lines are connected in parallel with a charge line connected to the gas supply source.

4. The layer deposition method of claim 1, wherein the gas comprises a source gas, a reaction gas, or a purge gas.

5. The layer deposition method of claim 1, wherein the gas is supplied into the plurality of gas filling tanks through a flow controller positioned on a charge line connected to a gas supply source.

6. The layer deposition method of claim 1, wherein each gas filling tank of the plurality of gas filling tanks is respectively connected to a discharge distribution line of a plurality of discharge distribution lines connected in parallel with the supply line.

7. The layer deposition method of claim 1, wherein the gas is simultaneously discharged from the plurality of gas filling tanks into the supply line.

8. The layer deposition method of claim 1, wherein the gas is sequentially discharged from plurality of gas filling tanks into the supply line.

9. The layer deposition method of claim 1, further comprising providing the pressure-elevated gas to a bottom surface of an opening of the substrate.

* * * * *